US010935700B2

(12) United States Patent
Hashimoto et al.

(10) Patent No.: US 10,935,700 B2
(45) Date of Patent: Mar. 2, 2021

(54) OPTICAL FILM AND IMAGE DISPLAY DEVICE

(71) Applicant: DAI NIPPON PRINTING CO., LTD., Tokyo (JP)

(72) Inventors: Yusuke Hashimoto, Tokyo (JP); Atsuhiro Kobayashi, Tokyo (JP); Seiichi Isojima, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 82 days.

(21) Appl. No.: 16/476,207

(22) PCT Filed: Dec. 28, 2017

(86) PCT No.: PCT/JP2017/047350
§ 371 (c)(1),
(2) Date: Oct. 9, 2019

(87) PCT Pub. No.: WO2018/128171
PCT Pub. Date: Jul. 12, 2018

(65) Prior Publication Data
US 2020/0386917 A1    Dec. 10, 2020

(30) Foreign Application Priority Data

Jan. 6, 2017 (JP) .............................. JP2017-001447

(51) Int. Cl.
| | |
|---|---|
| *B32B 3/00* | (2006.01) |
| *G02B 1/14* | (2015.01) |
| *H01L 51/52* | (2006.01) |
| *B32B 27/08* | (2006.01) |
| *B32B 7/12* | (2006.01) |
| *B32B 27/34* | (2006.01) |
| *B32B 27/28* | (2006.01) |

(52) U.S. Cl.
CPC .................. *G02B 1/14* (2015.01); *B32B 7/12* (2013.01); *B32B 27/08* (2013.01); *B32B 27/281* (2013.01); *B32B 27/34* (2013.01); *H01L 51/5253* (2013.01); *B32B 2255/10* (2013.01); *B32B 2457/206* (2013.01); *H01L 2251/5338* (2013.01)

(58) Field of Classification Search
CPC ... G02B 1/14; H01L 51/5253; H01L 51/0097; B32B 7/12; B32B 27/08; B32B 27/281; B32B 27/34; B32B 2457/206; B32B 2255/28; B32B 2255/10
See application file for complete search history.

(56) References Cited

U.S. PATENT DOCUMENTS

| | | | |
|---|---|---|---|
| 9,127,915 B1 | 9/2015 | Tsai et al. | |
| 10,033,015 B1 * | 7/2018 | Brotzman | ............. B32B 27/325 |
| 10,632,711 B2 * | 4/2020 | Lee | ......................... B32B 7/022 |
| 10,667,417 B2 * | 5/2020 | Choi | ................... H01L 51/5237 |
| 2014/0291648 A1 | 10/2014 | Yamazaki et al. | |
| 2016/0046103 A1 * | 2/2016 | Hong, II | ................... B32B 7/12 |
| | | | 428/336 |
| 2016/0194448 A1 | 7/2016 | Song et al. | |
| 2017/0274933 A1 | 9/2017 | Tyan | |

FOREIGN PATENT DOCUMENTS

| | | |
|---|---|---|
| CN | 105934339 | 9/2016 |
| JP | 2004-311664 | 11/2004 |
| JP | 2005-314563 | 11/2005 |
| JP | 2016-125063 | 7/2016 |
| WO | 2010/067857 | 6/2010 |

OTHER PUBLICATIONS

International Search Report, issued in the corresponding PCT Application No. PCT/JP2017/047350, dated Mar. 6, 2018, 5 pages.
International Preliminary Report on Patentability, issued in the corresponding PCT Application No. PCT/JP2017/047350, dated Jul. 9, 2019, 11 pages.
Chinese Office Action, issued in the corresponding Chinese Patent Application No. 201780085597.6, dated Oct. 29, 2020, 15 pages.

* cited by examiner

*Primary Examiner* — Elizabeth E Mulvaney
(74) *Attorney, Agent, or Firm* — Hamre, Schumann, Mueller & Larson, P.C.

(57) ABSTRACT

One aspect of the present invention provides a foldable light-transmitting optical film 10 for use in an image display device 50, which includes a resin base material 11, a hard coat layer 12 provided on the first surface 11A of the resin base material 11, and a resin layer 13 having a film thickness of 50 μm or more and 300 μm or less and provided on the second surface 11B of the resin base material 11 that is opposite to the first surface 11A, wherein the shear storage modulus (G') of the optical film 10 at 25° C. in the frequency range from 500 Hz to 1000 Hz inclusive is more than 200 MPa and 1200 MPa or less, and the shear loss modulus (G") of the optical film at 25° C. in the frequency range from 500 Hz to 1000 Hz inclusive is 3 MPa or more and 150 MPa or less.

6 Claims, 4 Drawing Sheets

OPTICAL FILM AND IMAGE DISPLAY DEVICE

CROSS-REFERENCE TO RELATED APPLICATION

The present application enjoys the benefit of priority to the prior Japanese Patent Application No. 2017-1447 (filed on Jan. 6, 2017), the entire disclosure of which is incorporated herein by reference.

TECHNICAL FIELD

The present invention relates to an optical film and an image display device.

BACKGROUND ART

Image display devices such as smartphone and tablet terminal have been popular in recent years, and development of foldable image display devices is currently ongoing. Such devices as smartphone and tablet terminal are usually covered with glass. However, if an image display device covered with glass is deliberately folded, the glass cover is highly likely to be cracked in spite of its high hardness. Thus, an optical film composed of a resin is contemplated, instead of a glass cover, for use in foldable image display devices (see, for example, Japanese Patent Application Publication No. 2016-125063).

SUMMARY OF THE INVENTION

In such a foldable image display device, the surface of the optical film may receive an impact, which requires the optical film to have some impact resistance. In this respect, an impact applied to the surface of the optical film may cause a depression on the surface of the optical film and also a damage to members, such as a display panel (for example, an organic light-emitting diode panel), located interior to the optical film in the image display device.

The depression on the surface of an optical film includes a depression attributed to the optical film itself and a depression attributed to an adhesive layer located interior to the optical film in an image display device. A "depression attributed to the optical film itself" refers to a depression formed by deformation of an optical film itself occurring when an impact is applied to the surface of the optical film, while a "depression attributed to an adhesive layer" refers to a depression formed by deformation of an optical film that follows plastic deformation of an adhesive layer located interior to the optical film in an image display device, the plastic deformation of the adhesive layer occurring due to the softness of the adhesive layer, when an impact is applied to the surface of the optical film.

Thus, excellent impact resistance is required in each optical film to inhibit depressions attributed to the optical film itself and to an adhesive layer and damages to members located interior to the optical film in an image display device when an impact is applied to the surface of the optical film; however, such optical films with excellent impact resistance have not yet been obtained.

The present invention is designed to solve the above-mentioned problem. That is, the object of the present invention is to provide a foldable optical film with excellent impact resistance and an image display device comprising the same foldable optical film.

The inventors intensively studied to solve the above-described problem and consequently found that excellent impact resistance is obtained in an optical film which has a structure comprising a hard coat layer on one surface of a resin base material and a resin layer on the other surface of the resin base material by limiting the film thickness of the resin layer to a thickness of 50 μm or more and 300 μm or less, and the shear storage modulus (G') and shear loss modulus (G") of the optical film at 25° C. in the frequency range from 500 Hz to 1000 Hz inclusive to values within predetermined ranges. The present invention was completed based on such findings.

One aspect of the present invention provides a foldable light-transmitting optical film for use in an image display device, comprising a resin base material, a hard coat layer provided on the first surface of the resin base material, and a resin layer having a film thickness of 50 μm or more and 300 μm or less and provided on the second surface of the resin base material that is opposite to the first surface, wherein the shear storage modulus (G') of the optical film at 25° C. in the frequency range from 500 Hz to 1000 Hz inclusive is more than 200 MPa and 1200 MPa or less, and the shear loss modulus (G") of the optical film at 25° C. in the frequency range from 500 Hz to 1000 Hz inclusive is 3 MPa or more and 150 MPa or less.

Preferably, no crack or break is formed in the above-described optical film after folding the optical film in a manner that leaves a gap of 30 mm between the opposite edges, unfolding the folded optical film, and repeating the process one hundred thousand times.

In the above-described optical film, the resin base material may be a base material containing a polyimide resin, a polyamide resin, or a combination thereof.

Another aspect of the present invention provides a foldable image display device, comprising a display panel and the above-described optical film placed on the observers side of the display panel, wherein the hard coat layer of the optical film is placed on the observers side of the resin base material.

The above-described image display device may further comprise an adhesive layer provided between the optical film and the display panel.

In the above-described image display device, the display panel may be an organic light-emitting diode panel.

According to one aspect of the present invention, a foldable optical film with excellent impact resistance can be provided. Additionally, according to another aspect of the present invention, an image display device comprising such an optical film can be provided.

DETAILED DESCRIPTION OF THE INVENTION

Figure 1:
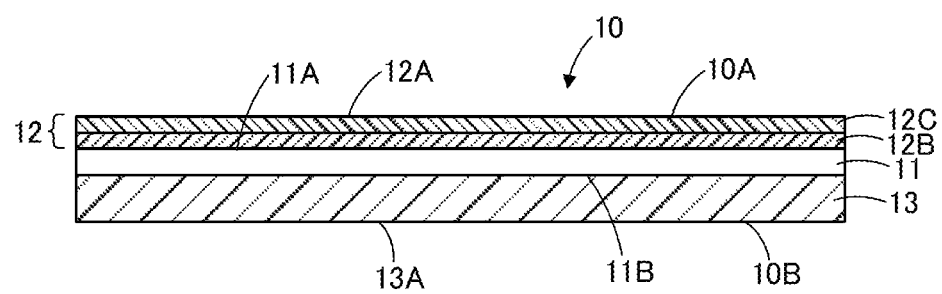
FIG. 1 depicts the schematic diagram of an optical film according to an embodiment.
Figure 2:
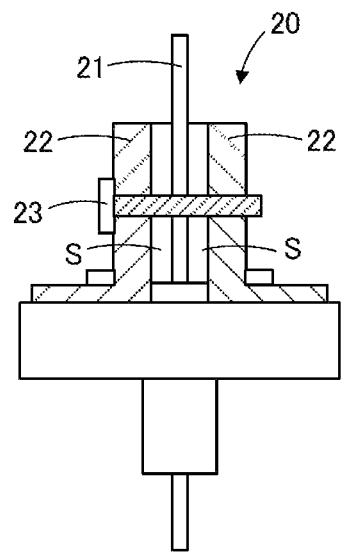
FIG. 2 depicts the schematic diagram of a solid shearing jig used for the measurement of shear storage modulus (G') and shear loss modulus (G").

Now, an optical film and an image display device according to an embodiment of the present invention are described with reference to the drawings. In this specification, the terms "film" and "sheet" are not distinguished from each other on the basis of the difference of names alone. For example, the term "film" is thus used to refer inclusively to an element called "sheet." FIG. 1 depicts the schematic diagram of the optical film according to the embodiment; FIG. 2 depicts the schematic diagram of a solid shearing jig used for the measurement of shear storage modulus (G') and shear loss modulus (G"); FIG. 3 schematically illustrates each step of the successive folding test; FIG. 4 schematically illustrates each step of the static folding test; FIG. 5 depicts the schematic diagram of another optical film according to an embodiment.

<<<Optical Film>>>

An optical film 10 shown in FIG. 1 is used in an image display device and is foldable and light transmissive. The term "light-transmitting" as used herein refers to a property that allows light transmission, including, for example, a total light transmittance of 50% or more, preferably 70% or more, more preferably 80% or more, and particularly preferably 90% or more. The term "light-transmitting" does not necessarily refer to transparency and may refer to translucency.

The optical film 10 comprises a resin base material 11, a hard coat layer 12 provided on the first surface 11A of the resin base material 11, and a resin layer 13 provided on the second surface 11B of the resin base material 11 that is opposite to the first surface 11A. A mold release film may be provided on a surface opposite to the surface of the resin layer 13 side in the resin base material 11. However, the physical properties and other properties of the optical film 10 described in this specification represent values measured in the optical film without a mold release film. Also, since the mold release film is peeled off from the optical film before use, the mold release film is not an integral part of the optical film.

In FIG. 1, the surface 10A of the optical film 10 corresponds to the surface 12A of the hard coat layer 12. In this specification, a surface of an optical film is used to refer to one surface of the optical film. Thus, a surface opposite to the surface of the optical film will be referred to as the back surface, distinguished from the surface of the optical film. The back surface 10B of the optical film 10 corresponds to the surface 13A, which is opposite to the surface of the resin base material 11 side in the resin layer 13.

In the optical film 10, the shear storage modulus (G') at 25° C. in the frequency range from 500 Hz to 1000 Hz inclusive is more than 200 MPa and 1200 MPa or less. In cases where the shear storage modulus (G') of an optical film is more than 200 mPa, not only deformation of the optical film itself but also plastic deformation of an adhesive layer can be reduced when an impact is applied to the surface of the optical film, even if the adhesive layer is placed interior to the optical film in an image display device. Additionally, in cases where the shear storage modulus (G') of an optical film with is 1200 MPa or less, crack of the optical film can be reduced when the optical film is folded. The lower limit of shear storage modulus (G') in the optical film 10 is preferably 400 MPa or more, more preferably 500 MPa or more. By the lower limit as defined above, a higher level of impact resistance can be achieved. The upper limit of shear storage modulus (G') in the optical film 10 is preferably less than 800 MPa. By the upper limit as defined above, suitable reversibility can be achieved when the optical film is folded, left static, and then unfolded.

In the optical film 10, the shear loss modulus (G") at 25° C. in the frequency range from 500 Hz to 1000 Hz inclusive is 3 MPa or more and 150 MPa or less. An optical film with a shear loss modulus (G") of less than 3 MPa may have a reduced impact-absorbing capacity. Additionally, an optical film with a shear loss modulus (G") of more than 150 MPa may have a resin layer with reduced hardness. The lower limit of shear loss modulus (G") in the optical film 10 is preferably 20 MPa or more, while the upper limit of shear loss modulus (G") in the optical film 10 is preferably 130 MPa or less, more preferably 100 MPa or less, in view of reducing the thickness of the optical film 10.

The shear storage modulus (G') and shear loss modulus (G") can be measured with a dynamic viscoelasticity meter (DMA). When the shear storage modulus (G') and shear loss modulus (G") of the optical film 10 are measured with a dynamic viscoelasticity meter (DMA), rectangular pieces of 10 mm×5 mm are first stamped out from the optical film 10 to obtain samples. Then, each of the two samples is mounted to an optional solid shearing jig of a dynamic viscoelasticity meter (product name "Rheogel-E4000"; manufactured by UBM Corporation). Specifically, the solid shearing jig 20 comprises, as shown in FIG. 2, one solid shearing metal plate 21 (inner plate) having a thickness of 1 mm and two L-shaped metal brackets 22 (outer plates) flanking the solid shearing plate 21. One sample S is held between the solid shearing plate 21 and one L-shaped metal bracket 22, and the other sample S is held between the solid shearing plate 21 and the other L-shaped metal bracket 22. In this case, each sample S is held in such a manner that the resin layer faces toward the solid shearing plate 21 and the hard coat layer faces toward the L-shaped metal bracket 22. Then, the distance between the L-shaped metal brackets is shortened by turning a screw 23 to hold the samples S. Subsequently, chucks for tensile testing, which consist of upper and lower chucks, are set into a dynamic viscoelasticity meter (product name "Rheogel-E4000"; manufactured by UBM Corporation). Then, the solid shearing jig is installed in a space between the upper and lower chucks with a distance of 20 mm. The distance refers to the distance between the upper and lower chucks. Then, the temperature is increased at a rate of 2° C./min to a predetermined temperature of 25° C. Under this condition, a vertical oscillation with a strain amount of 1% and with a frequency ranging from 500 Hz to 1000 Hz is applied to the two L-shaped metal brackets with keeping the solid shearing plate fixed to perform the dynamic viscoelasticity measurement of solid material at 25° C., whereby the shear storage modulus (G') and shear loss modulus (G") of the optical film 10 are measured. In this respect, the shear storage modulus (G') and shear loss modulus (G") of the optical film in the frequency range from 500 Hz to 1000 Hz inclusive are defined as the arithmetic means of three measurements, where the arithmetic means are determined by applying the vertical oscillation with frequencies of 500 Hz, 750 Hz, and 950 Hz to the L-shaped metal brackets to measure the shear storage modulus (G') and shear loss modulus (G") of the optical film at the respective frequencies; calculating the arithmetic means of these measured shear storage modulus (G') and shear loss modulus (G"); and repeating the same measurement three times and further arithmetically averaging the arithmetic means obtained from the three measurements. As seen above, the frequency range from 500 Hz to 1000 Hz is selected because the frequencies within the frequency range correspond to frequencies at which a free-falling object from a height of several centimeters produces a depression of several to tens micrometers on the surface of the optical film and a damage to, for example, a display panel located interior to the optical film in an image display device.

In cases where an additional film, such as polarizing plate, is provided on one surface of the optical film 10 through an adhesive or adhesion layer, the shear storage modulus (G') and shear loss modulus (G") should be measured after removing the additional film and the adhesive or adhesion layer. The additional film can be removed, for example, as follows. First of all, a laminate composed of an optical film attached to an additional film through an adhesive or adhesion layer is heated with a hair dryer and is slowly separated by inserting a cutter blade into a possible interface between the optical film and the additional film. By repeating such a process of heating and separation, the adhesive or adhesion layer and the additional film can be removed. Even if such a removal process is performed, the results of the shear storage modulus (G') and shear loss modulus (G") measurements are not significantly affected.

The optical film 10 is foldable. Specifically, no crack or break is formed in the optical film 10 even in cases where the below-described folding test (successive folding test) is repeated on the optical film preferably one hundred thousand times, more preferably two hundred thousand times, and further preferably one million times. In cases where the successive folding test is repeated on the optical film 10 one hundred thousand times and the optical film 10 is, for example, cracked, the optical film 10 shows low foldability. The successive folding test may be carried out by folding the optical film 10 in such a manner that the hard coat layer 12 faces either inward or outward. In either case, no crack or break is preferably formed in the optical film.

In cases where an additional film, such as polarizing plate, is provided on one surface of the optical film 10 through an adhesive or adhesion layer, the successive folding test should be carried out after removing the additional film and the adhesive or adhesion layer by the same procedure as described above. Even if such a removal process is performed, the result of the successive folding test is not significantly affected.

Figure 3A:
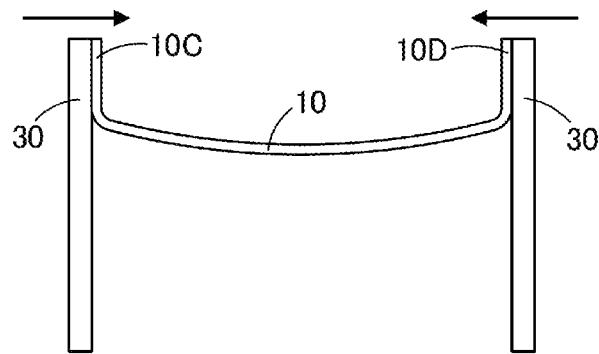
FIG. 3(A) to FIG. 3(C) schematically illustrate each step of the successive folding test.

The successive folding test is carried out as follows. The successive folding test starts with fixing the edge 10C and the opposite edge 10D of the optical film 10 to fixing members 30 arranged in parallel to each other, as shown in FIG. 3(A). Although the optical film 10 may be in any shape, the optical film 10 used for the successive folding test preferably has a rectangular shape (for example, a rectangle of 30 mm×100 mm). In addition, the fixing members 30 can slide in the horizontal direction, as shown in FIG. 3(A).

Figure 3B:
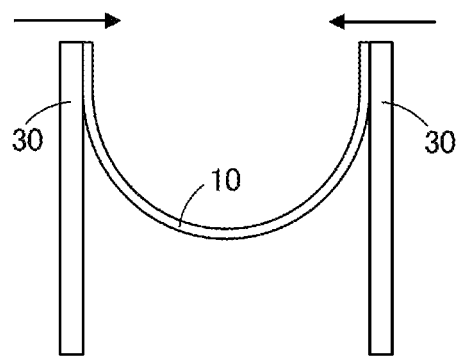
Figure 3C:
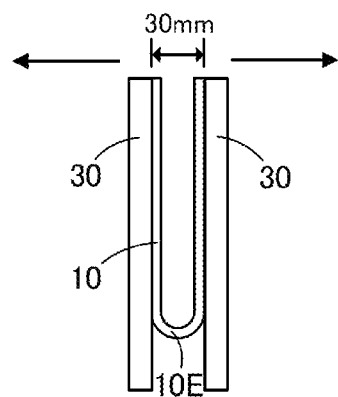

Next, the fixing members 30 are moved close to each other to fold and deform the optical film 10, as shown in FIG. 3(B); the fixing members 30 are further moved until a gap of 30 mm is left between the two opposing edges of the optical film 10 fixed to the fixing members 30, as shown in FIG. 3(C); subsequently, the fixing members 30 are moved in opposite directions to resolve the deformation of the optical film 10.

As shown in FIGS. 3(A) to (C), the fixing members 30 can be moved to fold the optical film 10 at an angle of 180 degrees. In addition, a gap of 30 mm can be maintained between the two opposing edges of the optical film 10 by carrying out the successive folding test in a manner that prevents the bent part 10E of the optical film 10 from being forced out beyond the lower edges of the fixing members 30 and controls the fixing members 30 to keep a distance of 30 mm when they approach closest to each other. In this case, the outer width of the bent part 10E is considered as 30 mm. The thickness of the optical film 10 is small enough as compared with the gap between the fixing members 30 (30 mm). Thus, it seems unlikely that a difference in the thickness of the optical film 10 affects the result of the successive folding test on the optical film 10. In the optical film 10, no crack or break is formed by the successive folding test in which the optical film is folded at an angle of 180 degrees to produce preferably a gap of 30 mm, more preferably a gap of 6 mm, further preferably a gap of 3 mm, most preferably a gap of 2 mm, between the opposing edges of the optical film, and unfolded, and the folding and unfolding process is repeated one hundred thousand times.

Figure 4A:
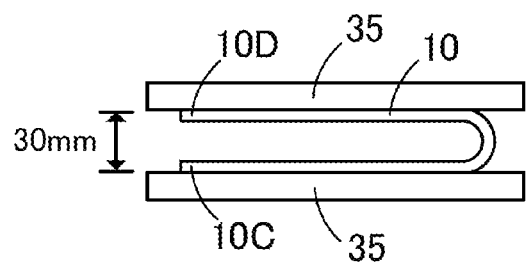
FIG. 4(A) and FIG. 4(B) schematically illustrate each step of the static folding test.
Figure 4B:
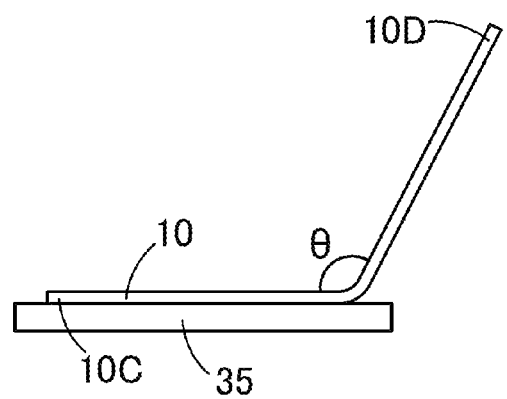
Figure 5:
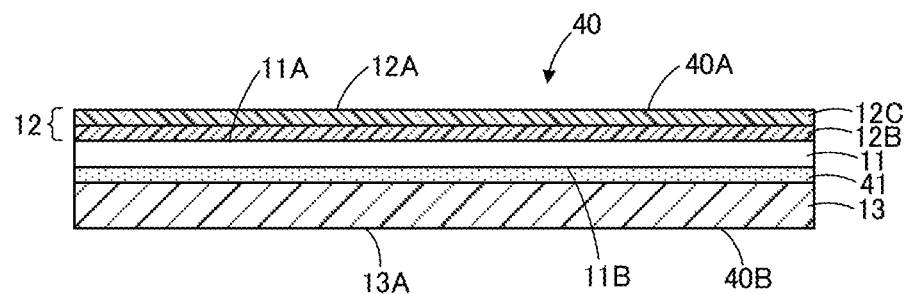
FIG. 5 depicts the schematic diagram of another optical film according to an embodiment.

When the optical film 10 is folded, as shown in FIG. 4(A), by fixing the edge 10C and the opposite edge 10D of the optical film 10 to fixing members 35 arranged in parallel to each other to produce a gap of 30 mm between the edges 10C and 10D and kept folded at 70° C. for 240 hours to perform the static folding test and the optical film 10 is then resolved after the static folding test from the folded state, as shown in FIG. 4(B), by removing one of the fixing members 35 from the edge 10D and left static for 30 minutes at room temperature to measure the opening angle θ, which is an angle naturally formed by the unfolded optical film 10, the opening angle θ of the optical film 10 is preferably 100° or more. A larger opening angle θ means more suitable reversibility, and the opening angle is at most 180°. The static folding test may be carried out by folding the optical film 10 in such a manner that the hard coat layer 12 faces either inward or outward. In either case, the opening angle θ is preferably 100° or more.

The surface 10A of the optical film 10 (the surface 12A of the hard coat layer 12) preferably has a hardness (pencil hardness) of B or harder, more preferably H or harder, when measured by the pencil hardness test specified by JIS K5600-5-4: 1999. However, the pencil hardness test will be performed by applying a load of 1 kg to a pencil and moving the pencil at a speed of 1 mm/sec. The grade of the hardest pencil that does not scratch the surface of an optical film during the pencil hardness test is determined as the pencil hardness of the optical film. A plural number of pencils with different hardness are used for the measurement of pencil hardness and the pencil hardness test is repeated five times on each pencil. In cases where no scratch is made on the surface of an optical film with a pencil with specific hardness in four or more out of the five replicates, the pencil with the hardness is judged as making no scratch on the surface of the optical film. The above-described scratch refers to a scratch which is visibly detectable when the surface of an optical film subjected to the pencil hardness test is observed under transmitting fluorescent light.

The optical film 10 preferably has a yellow index (YI) of 15 or less. In cases where the optical film 10 has a YI of more than 15, the optical film is so yellow that the optical film is unlikely to be applicable to uses that require the optical film to be transparent. The yellow index (YI) is a value measured using a spectrophotometer (product name "UV-3100PC", manufactured by Shimadzu Corporation; light source: tungsten lamp and deuterium lamp). The upper limit of yellow index (YI) in the optical film 10 is more preferably 10 or less.

Additionally, in cases where an additional film, such as polarizing plate, is provided on one surface of the optical film 10 through an adhesive or adhesion layer, the yellow index (YI) should be measured after removing the additional film and the adhesive or adhesion layer by the same procedure as described above. Even if such a removal process is performed, measurement of the yellow index (YI) is not significantly affected.

The yellow index (YI) of the optical film 10 may be adjusted, for example, by adding a blue coloring substance, which is complementary to yellow color, to the resin base material 11 or the resin layer 13. Even if use of a polyimide base material as the resin base material results in a yellow color problem, the yellow index (YI) of the optical film can be decreased by adding a blue coloring substance to the resin base material 11 or the resin layer 13.

The above-described blue coloring substance may be either a pigment or a dye, and preferably has both light and heat resistance in cases where, for example, the optical film 10 is used in an organic light-emitting diode display device. As the above-described blue coloring substance, an organic pigment such as a polycyclic organic or metal complex organic pigment is less prone to molecular breakage by ultraviolet light, in contrast to the tendency to form a molecular dispersion of the pigment itself, and has a further excellent light resistance, and is thus suitable for uses that require an optical film to be, for example, light resistant. More specifically, phthalocyanine organic pigments are suitable. However, pigment particles are dispersed in a solvent and the scattered particles cause loss of transparency. Thus, the size of dispersed pigment particles is preferably in the Rayleigh scattering region. On the other hand, in cases where the transparency of an optical film is critical, a pigment which is well dispersed in a solvent is preferably used as the above-described blue coloring substance.

The optical film 10 preferably has a light transmittance of 8% or less at a wavelength of 380 nm. In cases where the above-described transmittance of the optical film is more than 8% and such an optical film is used in a mobile terminal, a polarizer inside the mobile terminal may be easily degraded by exposure to ultraviolet light. The above-described transmittance can be measured using a spectrophotometer (product name "UV-3100PC"; manufactured by Shimadzu Corporation; light source: tungsten lamp and deuterium lamp). The arithmetic mean of three measurements is determined as the above transmittance. The maximum light transmittance of the optical film 10 is more preferably 5%. The above-described transmittance of the optical film 10 can be achieved by adjusting the amount of the below-described ultraviolet absorber added to the resin layer 13.

The optical film 10 preferably has a haze value (total haze value) of 2.5% or less. In cases where the above-described haze value of the optical film is more than 2.5% and such an optical film is used in a mobile terminal, the image display screen of the mobile terminal may turn white in color. The above-described haze value is more preferably 1.5% or less, still more preferably 1.0% or less.

The above-described haze value can be measured using a haze meter (product name "HM-150"; manufactured by Murakami Color Research Laboratory Co., Ltd.) in accordance with JIS K7136: 2000. The above-described haze value is defined as the arithmetic mean of three haze values, wherein the three haze values are obtained by cutting a piece of 50 mm×100 mm from one optical film and placing the piece of film without curl or wrinkle and without any dirt, such as fingerprints or dust, into the haze meter in such a manner that the surface of the optical film faces opposite to the light source to measure the haze value, and repeating the measurement three times. The phrase "measured three times" as used herein should refer not to measuring at the same position three times but to measuring at three different positions. In the optical film 10, the resin layer 12 as well as the surface 10A is visually observed to be flat and also has a deviation in film thickness within ±10%. Accordingly, it is considered that an approximate average haze value of the whole optical film can be obtained by measuring the haze value at three different positions on the piece cut out from the optical film. The deviation in haze value is within ±10% even if a measurement object has a size as large as 1 m×3000 m or has the same size as a 5-inch smartphone. If a piece having the same size as described above cannot be cut out from the optical film, a piece having a size equal to or greater than a diameter of 21 mm is required because, for example, the HM-150 haze meter has an entrance port aperture having a diameter of 20 mm for use in the measurement. Thus, a piece having a size of 22 mm×22 mm or larger may be cut out from the optical film as appropriate. If the optical film is small in size, the electroconductive film is gradually shifted or turned in such an extent that the light source spot is within the piece of film to secure three measurement positions.

Additionally, in cases where an additional film, such as polarizing plate, is provided on one surface of the optical film 10 through an adhesive or adhesion layer, the haze value should be measured after removing the additional film and the adhesive or adhesion layer by the same procedure as described above and wiping out dirt from the adhesive or adhesion layer with an alcohol. Even if such a removal process is performed, measurement of the haze value is not significantly affected.

Light emitting diodes are actively employed in recent years as the backlight source for image display devices such as personal computers and tablet terminals, and such light emitting diodes strongly emit light called blue light. The blue light has a wavelength of 380 to 495 nm and other properties similar to those of ultraviolet light, and the energy of the blue light is so high that the blue light passing into the retina without being absorbed by the cornea and the crystalline lens is considered as a cause of retinal damage, eye strain, sleep disorder, and the like. Thus, it is preferred that an optical film used in an image display device has no influence on the color representation on a display screen and to have an excellent blue light blocking property. Therefore, the optical film 10 preferably has a spectral transmittance of less than 1% at a wavelength of 380 nm, a spectral transmittance of less than 10% at a wavelength of 410 nm, and a spectral transmittance of 70% or more at a wavelength of 440 nm in view of blue light blocking effect because the above-described optical film having a spectral transmittance of 1% or more at a wavelength of 380 nm or a spectral transmittance of 10% or more at a wavelength of 410 nm may not solve blue light problems and the optical film having a spectral transmittance of less than 70% at a wavelength of 440 nm may give some effects on the color representation on the display screen of an image display device in which the optical film is used. In the blue light wavelength range, the optical film 10 can sufficiently absorb light with wavelengths equal to and under 410 nm and sufficiently pass light with wavelengths equal to and above 440 nm, and can exhibit excellent blue light blocking performance without affecting the color representation on a display screen. Additionally, use of the optical film 10 with such an excellent blue light blocking property in an organic light-emitting diode (OLED) display device as an image display device effectively inhibits degradation of the organic light-emitting diode device.

Preferably, the optical film 10 has a transmittance of nearly 0% in the wavelength range up to 380 nm, gradually increases the light transmittance in the wavelength range above 410 nm, and exhibits a sharp increase in light transmittance at a wavelength of around 440 nm. Specifically, the spectral transmittance of the optical film preferably varies sigmoidally with the wavelength, for example, from 410 nm to 440 nm. The above-described spectral transmittance at a wavelength of 380 nm is more preferably less than 0.5%, further preferably less than 0.2%; the spectral transmittance at a wavelength of 410 nm is more preferably less than 7%, more preferably less than 5%; the spectral transmittance at a wavelength of 440 nm is more preferably 75% or more, further preferably 80% or more. The optical film 10 preferably has a spectral transmittance of less than 50% at a wavelength of 420 nm. The optical film 10 fulfilling such requirements with respect to spectral transmittance exhibits a sharp increase of transmittance at a wavelength of around 440 nm and can obtain a very excellent blue light-blocking property without affecting the color representation on a display screen.

The optical film 10 more preferably has a spectral transmittance of less than 0.1% at a wavelength of 380 nm, a spectral transmittance of less than 7% at a wavelength of 410 nm, and a spectral transmittance of 80% or more at a wavelength of 440 nm.

In the optical film 10, the slope a of the transmittance spectrum as a function of wavelength obtained by applying the least square method to the transmittance in the spectral range from 415 nm to 435 nm is preferably more than 2.0. In cases where the above-described slope a is 2.0 or less, the optical film fails to cut a sufficient amount of light in the blue light wavelength range, such as a wavelength range from 415 to 435 nm, and may exhibit an attenuated blue light-cutting function. Additionally, an excess amount of light in the blue light wavelength range (wavelengths from 415 to 435 nm) may be cut off, which interferes the backlight or the light in a wavelength range emitted from an image display device (for example, light with wavelengths equal to and above 430 nm emitted from an OLED) and may increase the possibility that problems such as poor color representation may occur. The above-described slope a can be calculated, for example, by measuring at least five points spaced 1 nm apart to obtain the transmittance in a range from 415 to 435 nm using a spectrophotometer with the ability to permit measurement to 0.5% accuracy (product name "UVPC-2450"; manufactured by Shimadzu Corporation).

The optical film 10 preferably has a blue light blocking rate of 40% or more. In cases where the blue light blocking rate is less than 40%, the above-described blue light problems may not be sufficiently resolved. The above-described blue light blocking rate is calculated according to, for example, JIS T7333: 2005. Such a blue light blocking rate can be effected, for example, by adding the below-described sesamol type benzotriazole monomer to the resin layer 13.

Examples of applications of the optical film 10 include, but are not particularly limited to, image display devices in smartphones, tablet terminals, personal computers (PCs), wearable terminals, digital signage systems, televisions, automotive navigation systems, and the like. Additionally, the optical film 10 is also suitable for vehicle displays. The form of each above-described image display device is also favorable for applications which require flexible forms, such as foldable or rollable forms.

The optical film 10 can be cut into a desired size or may be rolled. In cases where the optical film 10 is cut into a desired size, the optical film is not limited to a particular size, and the size of the film is appropriately determined depending on the display size of an image display device. Specifically, the optical film 10 may be, for example, 2.8 inches or more and 500 inches or less in size. The term "inch" as used herein shall refer to the length of a diagonal when the optical film is rectangular, and to the length of a diameter when the optical film is circular, and to the average of major and minor axes when the optical film is elliptical. In this respect, if the optical film is rectangular, the aspect ratio of the optical film is not limited to a particular ratio when the above-described size in inch is determined, as long as no problem is found with the optical film used for the display screen of an image display device. Examples of the aspect ratio include height-to-width ratios of 1:1, 4:3, 16:10, 16:9, and 2:1. However, particularly in optical films used for vehicle displays and digital signage systems which are rich in designs, the aspect ratio is not limited to the above-described aspect ratios. Additionally, in cases where the optical film 10 is large in size, the optical film will be trimmed to the A5 size (148 mm×210 mm) starting at an arbitrary position and then trimmed to fit size requirements of each measurement item.

In an image display device, the optical film 10 may be installed inside the image display device, and is preferably installed near the surface of the image display device. In cases of being installed near the surface of an image display device, the optical film 10 serves as a cover film, which is used instead of a glass cover.

<<Resin Base Material>>

The resin base material 11 is a base material containing a light-transmitting resin. The thickness of the resin base material 11 is preferably 10 µm or more and 100 µm or less. In cases where the thickness of the resin base material is less than 10 µm, a resulting optical film may be tightly curled and also have insufficient hardness and, furthermore, such an optical film produced by roll-to-roll process is prone to forming wrinkles and is likely to deteriorate the appearance. On the other hand, in cases where the thickness of the resin base material is more than 100 µm, a resulting optical film may not satisfy the conditions required by the successive folding test due to poor foldability and, moreover, becomes heavy and is undesirable in terms of weight saving. The thickness of the resin base material is defined as the arithmetic mean of film thickness values measured at 20 different locations, where a cross-section of the resin base material is imaged using a scanning electron microscope (SEM) and the film thickness of the resin base material is measured at the 20 locations within the image of the cross-section. The method of acquiring cross-sectional images of the resin base material is the same as the method of acquiring cross-sectional images of the hard coat layer. The lower limit of the resin base material 11 is more preferably 25 µm or more in thickness, while the upper limit of the resin base material 11 is more preferably 80 µm or less in thickness.

Examples of the constituent resin of the resin base material 11 include polyimide resins, polyamide-imide resins, polyamide resins, and polyester resins (such as polyethylene terephthalate resins and polyethylene naphthalate resins), or combinations of two or more of these resins. Among those resins, polyimide resins, polyamide resins, and combinations thereof are preferred in terms of several criteria: these resins have excellent hardness and transparency as well as are less cracked or broken during the successive folding test, and also have excellent heat resistance, and can achieve further excellent hardness and transparency by backing.

A polyimide resin can be obtained from the reaction between a tetracarboxylic component and a diamine component. Preferably, a tetracarboxylic component and a diamine component are polymerized to form a polyamic acid, which is then imidized. The imidization may be heat imidization or chemical imidization. Additionally, a polyimide resin can also be produced by a combinational method of heat imidization and chemical imidization. The polyimide resin may be an aliphatic polyimide resin, but is preferably an aromatic polyimide resin which contains aromatic rings. The aromatic polyimide resin is composed of a tetracarboxylic component and a diamine component, at least one of which is an aromatic ring-containing component.

As specific examples of the tetracarboxylic component, tetracarboxylic dianhydrides are suitably used, including cyclohexane tetracarboxylic dianhydride, cyclopentane tetracarboxylic dianhydride, dicyclohexane-3,4,3',4'-tetracarboxylic dianhydride, pyromellitic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2',3,3'-biphenyl tetracarboxylic dianhydride, 2,2-bis(3,4-dicarboxyphenyl) propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 4,4'-(hexafluoroisopropylidene)diphthalic anhydride, 3,4'-(hexafluoroisopropylidene)diphthalic anhydride, 3,3'-(hexafluoroisopropylidene)diphthalic anhydride, 2,3,6,7-naphthalene tetracarboxylic dianhydride, 1,4,5,8-naphthalene tetracarboxylic dianhydride, 1,2,5,6-naphthalene tetracarboxylic dianhydride, 1,2,3,4-benzene tetracarboxylic dianhydride, 3,4,9,10-perylene tetracarboxylic dianhydride, 2,3,6,7-anthracene tetracarboxylic dianhydride, 1,2,7,8-phenanthrene tetracarboxylic dianhydride, and the like. These may be used individually or in combination of two or more.

As specific examples of the diamine component, p-phenylenediamine, m-phenylenediamine, o-phenylenediamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 4,4'-diaminobenzanilide, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminopheno)benzene, 1,3-bis(4-aminopheno)benzene, 1,4-bis(3-aminopheno)benzene, 1,4-bis(4-aminopheno)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminopheno)pyridine, N,N'-bis(4-aminophenyl)terephthalamide, 9,9-bis(4-aminophenyl)fluorene, 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, 3,3'-dimethyl-4,4'-diaminobiphenyl, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminopheno)phenyl]propane, 2,2-bis[4-(4-aminopheno)phenyl]propane, 2,2-bis[3-(3-aminopheno)phenyl]-1,1,1,3,3,3-hexafluoropropane, 2,2-bis[4-(4-aminopheno)phenyl]-1,1,1,3,3,3-hexafluoropropane, 1,3-bis[4-(3-aminopheno)benzoyl]benzene, 1,3-bis[4-(4-aminopheno)benzoyl]benzene, 1,4-bis[4-(3-aminophenoxy)benzoyl]benzene, 1,4-bis[4-(4-aminopheno)benzoyl]benzene, 1,3-bis[4-(3-aminophenoxy)-α,α-dimethylbenzyl]benzene, 1,3-bis[4-(4-aminopheno)-α,α-dimethylbenzyl]benzene, 1,4-bis[4-(3-aminopheno)-α,α-dimethylbenzyl]benzene, 1,4-bis[4-(4-aminopheno)-α,α-dimethylbenzyl]benzene, 4,4'-bis[4-(4-aminophenoxy)benzoyl]diphenyl ether, 4,4'-bis[4-(4-amino-α,α-dimethylbenzyl) phenoxy]benzophenone, 4,4'-bis[4-(4-amino-α,α-dimethylbenzyl) phenoxy]diphenylsulfone, 4,4'-bis[4-(4-aminophenoxy) phenoxy]diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminopheno)-3,3,3',3'-tetramethyl-1,1'-spirobiindane, 6,6'-bis(4-aminophenoxy)-3,3,3',3'-tetramethyl-1,1'-spirobiindane, 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl)ether, bis(2-aminoethyl)ether, bis(3-aminopropyl)ether, bis(2-aminomethoxy)ethyl]ether, bis[2-(2-aminoethoxy)ethyl]ether, bis[2-(3-aminopropyl)ethyl]ether, trans-cyclohexane diamine, trans-1,4-bismethylenecyclohexane diamine, 2,6-bis(aminomethyl)bicyclo[2,2,1]heptane, and 2,5-bis(aminomethyl)bicyclo[2,2,1]heptane can be used; additionally, diamines resulting from substitution of some or all hydrogen atoms in an aromatic ring of each of the above-described diamines with a substituent(s) selected from fluoro, methyl, methoxy, trifluoromethyl and trifluoromethoxy groups can also be used. These may be used individually or in combination of two or more.

For improving the light transmittance and the rigidity, the polyimide resin preferably comprises an aromatic ring and at least one selected from the group consisting of: (i) fluorine, (ii) an aliphatic ring, and (iii) a linking group that interrupts the electron conjugation between donor and acceptor aromatic rings, more preferably an aromatic ring and at least (i) or (iii). In a polyimide resin, the presence of an aromatic ring enhances the orientation of the polyimide resin itself and increases the rigidity but tends to decrease the transmittance depending on the absorption wavelength of the aromatic ring. In cases where the polyimide resin comprises (i) fluorine, the fluorine atoms can give the polyimide backbone an electron configuration to inhibit electron transfer, and consequently improves the light transmittance. Also, in cases where the polyimide resin comprises (ii) an aliphatic ring, the aliphatic ring can interrupt the pi-electron conjugation within the polyimide backbone to inhibit electron transfer within the backbone, and consequently improves the light transmittance. Furthermore, in cases where the polyimide resin comprises (iii) a linking group that interrupts the electron conjugation between donor and acceptor aromatic rings, the linking group can interrupt the pi-electron conjugation within the polyimide backbone to inhibit electron transfer within the backbone, and consequently improves the light transmittance. Examples of such a linking group that interrupts the electron conjugation between donor and acceptor aromatic rings include ether linkage, thioether linkage, carbonyl linkage, thiocarbonyl linkage, amide linkage, sulfonyl linkage, and, sulfinyl linkage, as well as divalent linking groups such as alkylene groups optionally substituted by fluorine.

Among those polyimide resins, a polyimide resin containing aromatic rings and fluorine atoms is preferably used in view of improving the light transmittance and the rigidity. As for the content of fluorine atoms in the fluorine atom-containing polyimide resin, the ratio of fluorine atom number (F) to carbon atom number (C), F/C, is preferably 0.01 or more, further preferably 0.05 or more, when those atom numbers are determined by analyzing the surface of the polyimide resin by X-ray photoelectron spectroscopy. On the other hand, an excessively high content of fluorine atoms is likely to result in reduction of, for example, the heat resistance inherent to the polyimide resin. Thus, the ratio of fluorine atom number (F) to carbon atom number (C), F/C, is preferably 1 or less, further preferably 0.8 or less. In this respect, the above-described ratio obtained by X-ray photoelectron spectroscopy (XPS) can be calculated from the atom percentages of the respective atoms measured using an X-ray photoelectron spectrometer (for example, Theta Probe, Thermo Scientific Inc.).

Additionally, a polyimide resin in which 70% or more of the hydrogen atoms bound to the carbon atoms are directly bound to the aromatic rings is preferably used in view of improving the light transmittance and the rigidity. In the polyimide resin, the ratio of the (number of) hydrogen atoms directly bound to the aromatic rings to the total (number of) hydrogen atoms bound to the carbon atoms is further preferably 80% or more, more preferably 85% or more. A polyimide in which 70% or more of the hydrogen atoms bound to the carbon atoms are directly bound to the aromatic rings is preferred because optical properties, particularly total light transmittance and yellow index (YI), vary less in the optical film even after a heating process in the atmosphere, such as a stretching process at a temperature of 200° C. or higher. A polyimide resin in which 70% or more of the hydrogen atoms bound to the carbon atoms are directly bound to the aromatic rings has a low reactivity with oxygen, so that it is predicted that the polyimide resin rarely changes its own chemical structure. A base material containing a polyimide resin is often used in devices that require taking advantage of the high heat resistance of the polyimide resin for a processing process involving a heating process in the production of the devices. A polyimide resin in which 70% or more of the hydrogen atoms bound to the carbon atoms are directly bound to the aromatic rings does not need the later stage processes performed in inert atmosphere to maintain the transparency of the resin and can thus advantageously save costs for equipment and for maintenance of the atmosphere. In this respect, the ratio of the (number of) hydrogen atoms directly bound to the aromatic rings to the total (number of) hydrogen atoms bound to the carbon atoms in a polyimide resin can be determined by analyzing degradation products of the polyimide using high-performance liquid chromatography, a gas chromatograph mass spectrometer, and NMR. For example, a sample is degraded with an aqueous alkaline solution or supercritical methanol and the obtained degradation products are separated by high-performance liquid chromatography. Each separated peak is qualitatively analyzed using a gas chromatograph mass spectrometer, NMR, and the like, while quantitatively analyzed using high-performance liquid chromatography, whereby the ratio of the (number of) hydrogen atoms directly bound to the aromatic rings to the total (number of) hydrogen atoms bound to the carbon atoms in the polyimide can be determined.

Additionally, the polyimide resin preferably has at least one structure selected from the group consisting of the structures represented by the general formula (1) below and the general formula (3) below, among others, in view of improving the light transmittance and the rigidity.

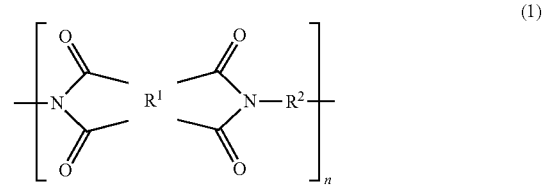

(1)

In the above-described general formula (1), $R^1$ represents a tetracarboxylic acid residue as a tetravalent group; $R^2$ represents at least one divalent group selected from the group consisting of trans-cyclohexanediamine residue, trans-1,4-bismethylene cyclohexanediamine residue, 4,4'-diaminodiphenyl sulfone residue, 3,4'-diaminodiphenyl sulfone residue, and divalent groups represented by the general formula (2) below; and n represents the number of repeating units, which is 1 or more. In this specification, the "tetracarboxylic acid residue" refers to a residue remaining after subtracting four carboxylic groups from a tetracarboxylic add, and represents the same structure as a residue remaining after subtracting the acid dianhydride structure from a tetracarboxylic dianhydride. Additionally, the "diamine residue" refers to a residue remaining after subtracting two amino groups from a diamine.

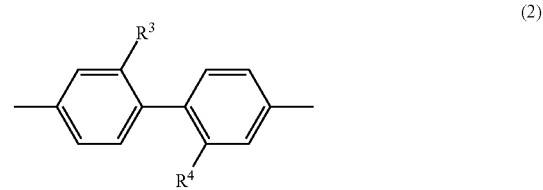

(2)

In the above-described general formula (2), $R^3$ and $R^4$ each independently represent a hydrogen atom, alkyl group, or perfluoroalkyl group.

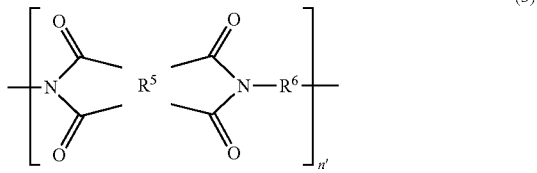

(3)

In the above-described general formula (3), $R^5$ represents at least one tetravalent group selected from the group consisting of cyclohexane tetracarboxylic acid residue, cyclopentane tetracarboxylic acid residue, dicyclohexane-3,4,3',4'-tetracarbmqic acid residue, and 4,4'-(hexafluoroisopropylidene)diphthalic add residue; $R^6$ represents a diamine residue as a divalent group; and n' represents the number of repeating units, which is 1 or more.

In the above-described general formula (1), $R^1$ refers to a tetracarboxylic add residue and can represent, as indicated above, a residue remaining after subtracting the acid dianhydride structure from a tetracarboxylic dianhydride. As $R^1$ in the above-described general formula (1), preferably at least one selected from the group consisting of 4,4'-(hexafluoroisopropylidene)diphthalic add residue, 3,3',4,4'-biphenyl tetracarboxylic add residue, pyromellitic add residue, 2,3',3,4'-biphenyl tetracarboxylic acid residue, 3,3',4,4'-benzophenone tetracarboxylic acid residue, 3,3',4,4'-diphenylsulfonetetracarboxylic add residue, 4,4'-oxydiphthalic acid residue, cyclohexane tetracarboxylic add residue, and cydopentane tetracarboxylic acid residue, further preferably at least one selected from the group consisting of 4,4'-(hexafluoroisopropylidene)diphthalic add residue, 4,4'-oxydiphthalic acid residue, and 3,3',4,4'-diphenylsulfonetetracarboxylic acid residue, is contained, among others, in view of improving the light transmittance and the rigidity.

As $R^1$, those suitable residues are contained preferably at a total concentration of 50% by mole or more, further preferably 70% by mole or more, and still further preferably 90% by mole or more.

Additionally, a combination of at least one selected from a group of tetracarboxylic acid residues suitable for improving the rigidity (group A), such as the group consisting of 3,3',4,4'-biphenyl tetracarboxylic acid residue, 3,3',4,4'-benzophenone tetracarboxylic add residue, and pyromellitic add residue, and at least one selected from a group of tetracarboxylic acid residues suitable for improving the transparency (group B), such as the group consisting of 4,4'-(hexafluoroisopropylidene)diphthalic acid residue, 2,3',3,4'-biphenyl tetracarboxylic acid residue, 3,3',4,4'-diphenylsulfone tetracarboxylic acid residue, 4,4'-oxydiphthalic add residue, cyclohexane tetracarboxylic acid residue, and cyclopentane tetracarboxylic acid residue, is preferably used as $R^1$.

For the content ratio of the group of tetracarboxylic acid residues suitable for improving the rigidity (group A) to the group of tetracarboxylic acid residues suitable for improving the transparency (group B) in that case, preferably 0.05 moles or more and 9 moles or less, further preferably 0.1 moles or more and 5 moles or less, still further preferably 0.3 moles or more and 4 moles or less, of the group of tetracarboxylic acid residues suitable for improving the rigidity (group A) are combined with 1 mole of the group of tetracarboxylic acid residues suitable for improving the transparency (group B).

In the above-described general formula (1), $R^2$ preferably represents at least one divalent group selected from the group consisting of 4,4'-diaminodiphenyl sulfone residue, 3,4'-diaminodiphenyl sulfone residue, and divalent groups represented by the above-described general formula (2), further preferably at least one divalent group selected from the group consisting of 4,4'-diaminodiphenyl sulfone residue, 3,4'-diaminodiphenyl sulfone residue, and divalent groups represented by the above-described general formula (2) where $R^3$ and $R^4$ each represent a perfluoroalkyl group, among others, in view of improving the light transmittance and the rigidity.

As $R^5$ in the above-described general formula (3), 4,4'-(hexafluoroisopropylidene)diphthalic acid residue, 3,3',4,4'-diphenylsulfone tetracarboxylic acid residue, and oxydiphthalic acid residue are preferably contained, among others, in view of improving the light transmittance and the rigidity.

As $R^5$, those suitable residues are contained preferably at a concentration of 50% by mole or more, further preferably 70% by mole or more, and still further preferably 90% by mole or more.

In the above-described general formula (3), $R^6$ refers to a diamine residue and can represent, as indicated above, a residue remaining after subtracting two amino groups from a diamine. As $R^6$ in the above-described general formula (3), preferably at least one divalent group selected from the group consisting of 2,2'-bis(trifluoromethyl)benzidine residue, bis[4-(4-aminophenoxy)phenyl]sulfone residue, 4,4'-diaminodiphenyl sulfone residue, 2,2-bis[4-(4-aminopheno)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl) phenoxy]benzene residue, 2,2-bis[4-(4-amino-2-trifluoromethylphenol)phenyl]hexafluoropropane residue, 4,4'-diamino-2-(trifluoromethyl)diphenyl ether residue, 4,4'-diaminobenzanilide residue, N,N'-bis(4-aminophenyl)terephthalamide residue, and 9,9-bis(4-aminophenyl)fluorene residue, further preferably at least one divalent group selected from the group consisting of 2,2'-bis(trifluoromethyl)benzidine residue, bis[4-(4-aminophenoxy)phenyl]sulfone residue, and 4,4'-diaminodiphenyl sulfone residue, is contained, among others, in view of improving the light transmittance and the rigidity.

As $R^6$, those suitable residues are contained preferably at a total concentration of 50% by mole or more, further preferably 70% by mole or more, and still further preferably 90% by mole or more.

Additionally, a combination of at least one selected from a group of diamine residues suitable for improving the rigidity (group C), such as the group consisting of bis[4-(4-aminophenoxy)phenyl]sulfone residue, 4,4'-diaminobenzanilide residue, N,N'-bis(4-aminophenyl)terephthalamide residue, para-phenylenediamine residue, meta-phenylenediamine residue, and 4,4'-diaminodiphenylmethane residue, and at least one selected from a group of diamine residues suitable for improving the transparency (group D), such as the group consisting of 2,2'-bis(trifluoromethyl)benzidine residue, 4,4'-diaminodiphenyl sulfone residue, 2,2-bis[4-(4-aminopheno)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl] hexafluoropropane residue, 4,4'-diamino-2-

(trifluoromethyl)diphenyl ether residue, and 9,9-bis(4-aminophenyl)fluorene residue, is preferably used as $R^6$.

For the content ratio of the group of diamine residues suitable for improving the rigidity (group C) to the group of diamine residues suitable for improving the transparency (group D) in that case, preferably 0.05 moles or more and 9 moles or less, further preferably 0.1 moles or more and 5 moles or less, more preferably 0.3 moles or more and 4 moles or less, of the group of diamine residues suitable for improving the rigidity (group C) are combined with 1 mole of the group of diamine residues suitable for improving the transparency (group D).

For the structures represented by the above-described general formulae (1) and (3), n and n' each independently represent the number of repeating units, which is 1 or more. The number of repeating units, n, in the polyimide may be appropriately selected depending on the structure to allow the polyimide to have a preferred glass transition temperature as described below, and is not limited to a particular number. The average number of repeating units is typically 10 to 2,000, further preferably 15 to 1,000.

Additionally, the polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic add residue such as terephthalic acid.

The polyimide resin preferably has a glass transition temperature of 250° C. or higher, further preferably 270° C. or higher, in terms of heat resistance, while the polyimide resin preferably has a glass transition temperature of 400° C. or lower, further preferably 380° C. or lower, in terms of ease of stretching and of reducing the baking temperature.

Specific examples of the polyimide resin include compounds having the structure represented by the formulae below. In the formulae below, n represents the number of repeating units, which is an integer of 2 or more.

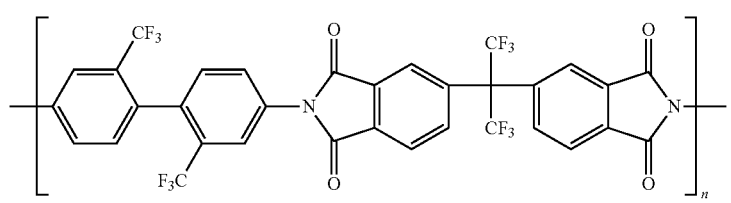

(4)

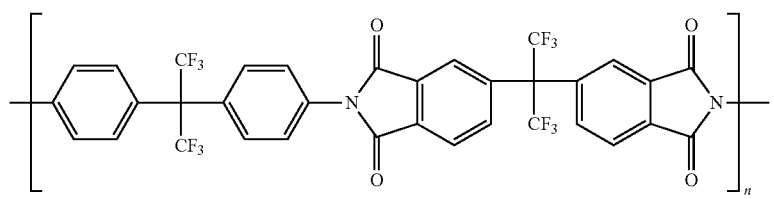

(5)

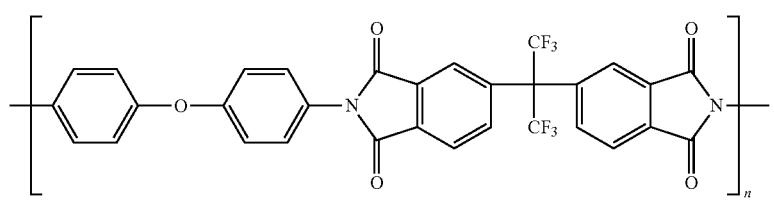

(6)

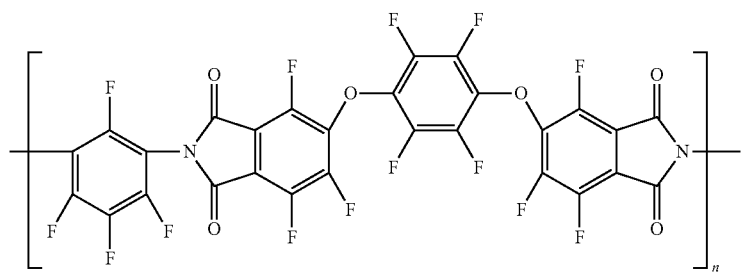

(7)

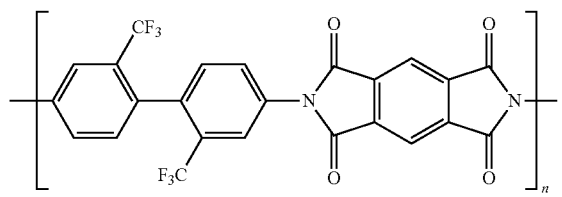

(8)

-continued
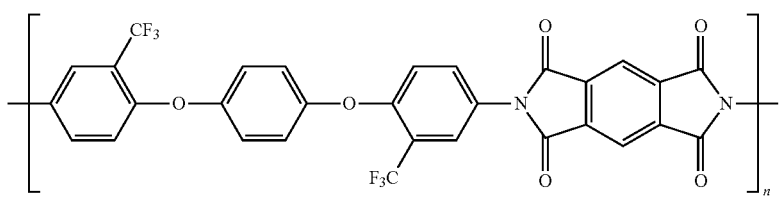
(9)
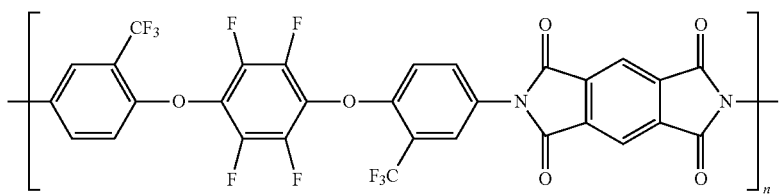
(10)
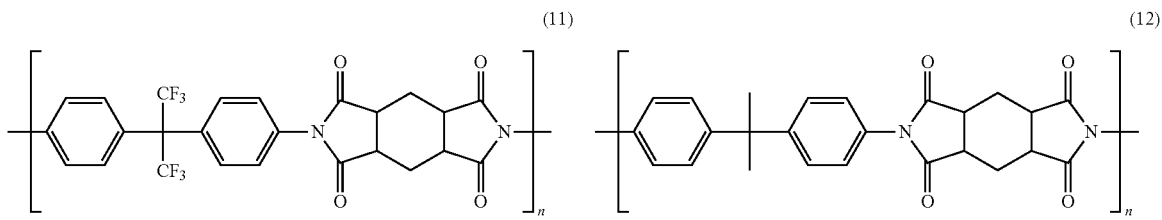
(11) (12)
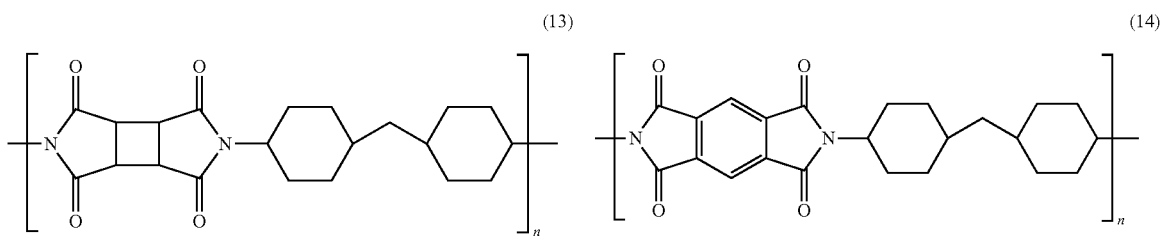
(13) (14)
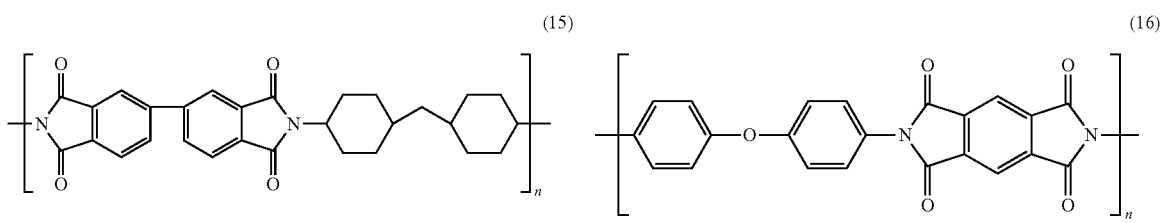
(15) (16)
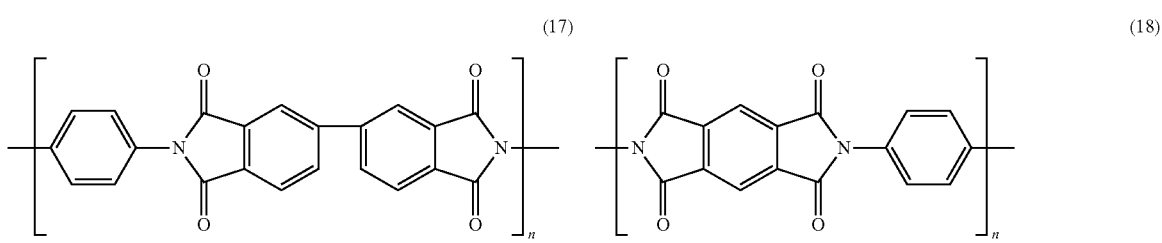
(17) (18)
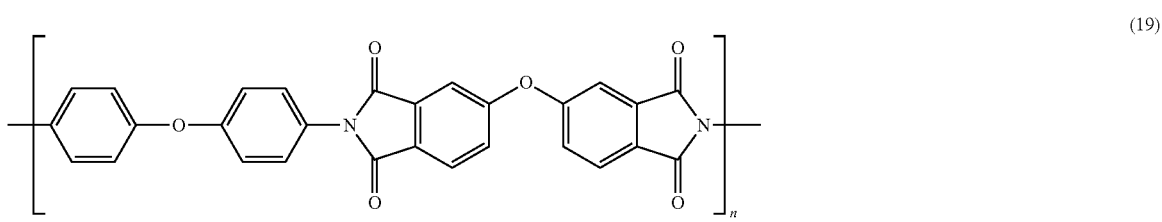
(19)

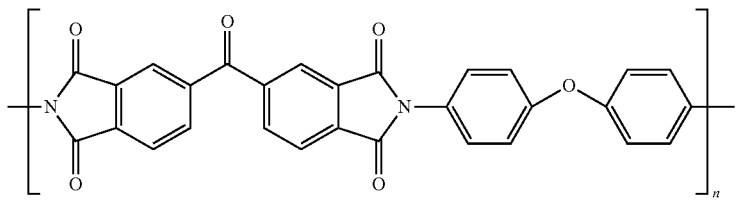
(20)

The concept of polyamide resin includes aromatic polyamides (aramids) as well as aliphatic polyamides. The polyamide resin generally refers to a resin having the backbone represented by the formula (21) or (22) below, and examples of the above-described polyamide resin include a compound represented by the formula (23) below. In the formulae below, n represents the number of repeating units, which is an integer of 2 or more.

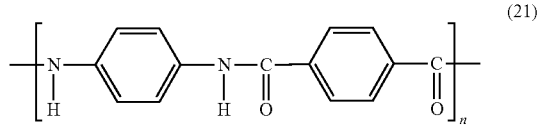
(21)

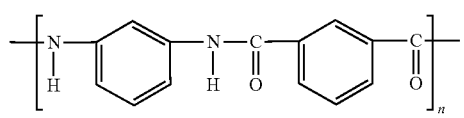
(22)

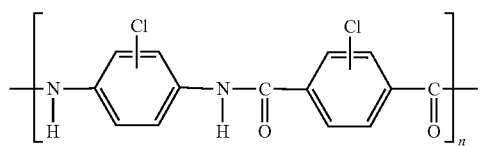
(23)

A commercially available base material may be used as a base material containing the polyimide or polyamide resin represented by any of the above-described formulae (4) to (20) and (23). Examples of a commercially available base material containing the above-described polyimide resin include Neopulim and the like manufactured by Mitsubishi Gas Chemical Company, Inc., while examples of a commercially available base material containing the above-described aramid resin include Mictron and the like manufactured by Toray Industries, Inc.

Additionally, polyimide or polyamide resins synthesized by any known methods may be used as the polyimide or polyamide resins represented by the above-described formulae (4) to (20) and (23). For example, the polyimide resin represented by the above-described formula (4) is synthesized by a method described Japanese Patent Application Publication No. 2009-132091 and can be obtained, specifically, by a reaction of 4,4'-hexafluoropropylidenebisphthalic dianhydride (FPA) and 2,2'-bis(trifluoromethyl)-4,4'-diaminobiphenyl (TFDB), as represented by the formula (24) below.

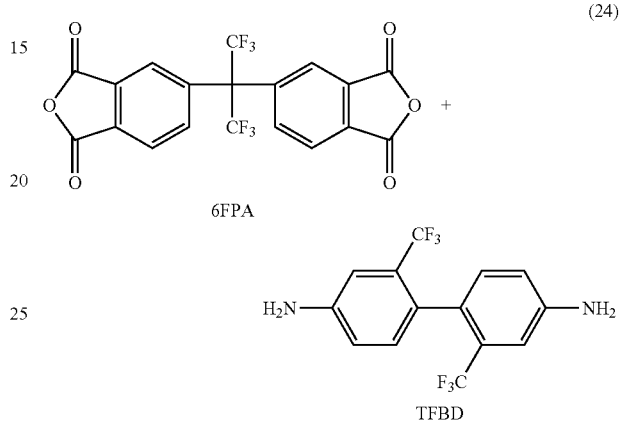
(24)

The weight average molecular weight of the above-described polyimide or polyamide resin preferably ranges from 3,000 to 500,000 inclusive, more preferably from 5,000 to 300,000, and further preferably from 10,000 to 200,000 inclusive. The resin with a weight average molecular weight of less than 3,000 may not have enough strength, while the resin with a weight average molecular weight of more than 500,000 has an increased viscosity and a reduced solubility, which in turn may result in failure to provide a base material with smooth surface and homogeneous film thickness. In this specification, the "weight average molecular weight" is measured by gel permeation chromatography (GPC) as a value in terms of polystyrene.

Among the above-described polyimide and polyamide resins, the polyimide or aramid resins having structures that inhibit intramolecular or intermolecular charge transfer are preferred due to the excellent transparency, specifically including the fluorinated polyimide resins represented by, for example, the above-described formulae (4) to (11), the polyimide resins containing alicydic structures represented by, for example, the above-described formulae (13) to (15), and the halogenated polyamide resin represented by, for example, the above-described formula (23).

Additionally, the fluorinated polyimide resins represented by, for example, the above-described formulae (4) to (11) each contain a fluorinated structure and thus have high heat resistance, which prevents a base material containing any of the polyimide resins from being colored by heat during the production process and allows the base material to have excellent transparency.

As the resin base material 11, a base material containing any of the fluorinated polyimide resins represented by, for example, the above-described formulae (4) to (11) or containing the halogenated aramid resin represented by, for example, the above-described formula (23) is preferably used in terms of the ability to improve the hardness. Among those, a base material containing the polyimide resin represented by the above-described formula (4) is more preferably used in terms of the ability to further improve the hardness.

Examples of the polyester resin include resins containing at least one constituent selected from polyethylene terephthalate, polypropylene terephthalate, polybutylene terephthalate, and polyethylene naphthalate.

<<Hard Coat Layer>>

The hard coat layer 12 shall refer to a layer exhibiting a Martens hardness of 375 MPa or more at the center of the cross-section of the hard coat layer 12. In this specification, the "Martens hardness" refers to a hardness measured when an indenter is pressed into a specimen to a depth of 500 nm in a nanoindentation hardness test. Measurement of the Martens hardness based on the above-described nanoindentation technique will be performed using a "TI950 TriboIndenter" manufactured by Hysitron, Inc. That is, a Berkovich indenter (trigonal pyramid) as the above-described indenter is pressed into the hard coat layer at the center of the cross-section to a depth of 500 nm, held at the position for a certain period of time to relax the residual stress, and then unloaded, under the following measurement conditions to measure the maximum load after the relaxation, and the maximum load $P_{max}$ (µN) and the area of the 500 nm deep indentation A (nm$^2$) are used to calculate the Martens hardness from the value of $P_{max/A}$. The arithmetic mean of the measurements at 10 different locations is determined as the Martens hardness.

(Measurement Conditions)
loading speed: 10 nm/sec;
retention time: 5 sec;
unloading speed: 10 nm/sec;
measurement temperature: 25° C.

The hard coat layer 12 preferably has a film thickness of 1 µm or more and 20 µm or less. In cases where the hard coat layer has a film thickness of less than 1 µm, the hard coat layer 12 is likely to have reduced hardness; additionally in cases where the hard coat layer has a film thickness of more than 20 µm, the hard coat layer has an excessively thick film thickness and is thus likely to reduce the processing properties. The "film thickness of the hard coat layer" as used herein shall refer to the sum of the film thickness (total thickness) of hard coat layers in cases where the hard coat layer has a multilayer structure. The upper limit of the hard coat layer 12 is more preferably 15 µm or less in thickness, further preferably 10 µm or less in thickness.

The film thickness of the hard coat layer is defined as the arithmetic mean of film thickness values measured at 20 different locations, where a cross-section of the hard coat layer is imaged using a scanning electron microscope (SEM) and the film thickness of the hard coat layer is measured at the 20 locations within the image of the cross-section. A specific method of acquiring cross-sectional images is described below. First of all, a piece of 1 mm×10 mm cut from an optical film is embedded in an embedding resin to prepare a block, and homogeneous sections having a thickness of 70 nm or more and 100 nm or less and having no openings or the like are sliced from the block according to a commonly used sectioning technique. For the preparation of sections, an "Ultramicrotome EM UC7" (Leica Microsystems GmbH) or the like can be used. Then, the block remaining after slicing the sections is used as a measurement sample. Subsequently, cross-sectional images of the measurement sample are acquired using a scanning electron microscope (SEM) (product name "S-4800"; manufactured by Hitachi High-Technologies Corporation). The cross-sectional images are acquired using the above-described S-4800 by setting the detector to "SE," the accelerating voltage to "5 kV," and the emission current to "10 µA." The focus, contrast, and brightness are appropriately adjusted at a magnification of 100 to 100,000 times, so that each layer can be identified by observation. Furthermore, the beam monitor aperture, the objective lens aperture, and the WD may be respectively set to "3," "3," and "8 mm," in acquirement of cross-sectional images using the above-described S-4800. For the measurement of the film thickness of a first layer, it is important that the contrast at the interfacial boundary between the hard coat layer and another layer (for example, the resin base material) can be observed as clearly as possible when the cross-section is observed. In cases where the interfacial boundary is hardly observed due to lack of contrast, a staining process may be applied because interfacial boundaries between organic layers become easily observed by application of a staining procedure with osmium tetraoxide, ruthenium tetraoxide, phosphotungstic add, or the like. Additionally, higher magnification may make it more difficult to find the interfacial contrast. In that case, the observation is also carried out with low magnification. For example, the observation is carried out with two magnifications consisting of a higher magnification, such as 25,000 or 50,000 times, and a lower magnification, such as 50,000 or 100,000 times, to determine the above arithmetic means at both magnifications, which are further averaged to determine the film thickness of the hard coat layer.

The hard coat layer may have a monolayer structure, but preferably has a multilayer structure composed of two or more hard coat layers in view of improving the foldability. The hard coat layer 12 illustrated in FIG. 1 is configured from a first hard coat layer 12B and a second hard coat layer 12C laminated to the first hard coat layer 12B.

<First Hard Coat Layer>

The first hard coat layer 12B is a layer mainly for providing hardness to the optical film. The first hard coat layer 12B preferably exhibits a Martens hardness of 500 MPa or more and 2000 MPa or less at the center of the cross-section of the first hard coat layer 12B. In cases where the Martens hardness is less than 500 MPa, the hard coat layer may have insufficient hardness; in cases where the Martens hardness is more than 2000 MPa, the resulting optical film may show low foldability. The minimum Martens hardness at half the height of the first hard coat layer 12B is preferably 600 MPa or more, while the maximum Martens hardness at the same position is preferably 1500 MPa or less.

The Martens hardness of the first hard coat layer 12B is preferably larger than the Martens hardness of the second hard coat layer 12C. The optical film 10 has a particularly desirable pencil hardness based on such relationship in the Martens hardness. This is because deformation is suppressed and a less severe form of scratch or depression is formed in the optical film 10 when a load is applied to press the point of a pencil down onto the optical film 10 in the pencil hardness test. Examples of a method of increasing the Martens hardness of the first hard coat layer 12B above the Martens hardness of the second hard coat layer 12C indude a method in which the content of the following inorganic particles is adjusted such that the first hard coat layer 12B contains a larger amount of the inorganic particles than the second hard coat layer 12C. Additionally, in cases where the hard coat layer has a monolayer structure, it is preferred that inorganic particles are unevenly distributed in the hard coat layer toward the base material film; that is, the abundance of the inorganic particles in the above-described hard coat layer is preferably increased toward the resin base material and decreased toward the surface of the optical film.

The first hard coat layer 12B contains a resin. The first hard coat layer 12B preferably further contains inorganic particles dispersed in the resin.

(Resin)

The resin comprises a polymerized product (a cured product) of a polymerizable compound (a curable compound). The polymerizable compound refers to a molecule having at least one polymerizable functional group. Examples of the polymerizable functional group indude ethylenic unsaturated groups such as (meth)acryloyl group, vinyl group, and allyl group. Both "acryloyl group" and "methacryloyl group" are meant by the word "(meth)acryloyl group."

The polymerizable compound is preferably a polyfunctional (meth)acrylate. Examples of the above-described polyfunctional (meth)acrylate indude trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric add tri(meth)acrylate, isocyanuric acid di(meth)acrylate, polyester tri(meth)acrylate, polyester di(meth)acrylate, bisphenol di(meth)acrylate, digylcerol tetra(meth)acrylate, adamantyl di(meth)acrylate, isobornyl di(meth)acrylate, dicyclopentane di(meth)acrylate, tricyclodecane di(meth)acrylate, ditrimethylolpropane tetra(meth)acrylate, and those compounds modified with PO, EO, caprolactone, or the like.

Among those polymerizable compounds, trifunctional to hexafunctional polymerizable compounds, such as pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca(meth)acrylate, are preferred in terms of the ability to achieve the above-described Martens hardness in a suitable manner. In this specification, the word "(meth)acrylate" means acrylate and methacrylate.

A monofunctional (meth)acrylate monomer may be further contained for the purpose of, for example, adjusting the hardness of the resin and the viscosity of the composition, and improving the adhesiveness of the resin. Examples of the above-described monofunctional (meth)acrylate monomer include hydroxyethyl acrylate (HEA), glycidyl methacrylate, methoxypolyethylene glycol (meth)acrylate, isostearyl (meth)acrylate, 2-acryloyloxyethyl succinate, acryloyl morpholine, N-acryloyloxyethyl hexahydrophthalimide, cydohexyl acrylate, tetrahydrofuryl acrylate, isobornyl acrylate, phenoxyethyl acrylate, and adamantyl acrylate.

The weight average molecular weight of the above-described monomer is preferably less than 1,000, more preferably 200 or more and 800 or less, in view of improving the hardness of the resin layer. Additionally, the weight average molecular weight of the above-described polymerizable oligomer is preferably 1,000 or more and 20,000 or less, more preferably 1,000 or more and 10,000 or less, and further preferably 2,000 or more and 7,000 or less.

(Inorganic Particles)

Silica particles are preferred as the inorganic particles in terms of the ability to achieve excellent hardness, though the inorganic particles are not limited to particular particles as long as those inorganic particles can improve the hardness of the hard coat layer. Among silica particles, reactive silica particles are preferred. The above-described reactive silica particles are silica particles that can form cross-linked structures with the above-described polyfunctional (meth)acrylate, and the presence of the reactive silica particles can sufficiently increase the hardness of the first hard coat layer 12B.

The above-described reactive silica particles preferably have any reactive functional group on the surface, and polymerizable functional groups, such as those described above, are suitably used as the reactive functional group.

The above-described reactive silica particles are not limited to a particular type of reactive silica particles, and conventionally known reactive silica particles can be used, examples of which include reactive silica particles described in Japanese Patent Application Publication No. 2008-165040. Additionally, examples of commercially available reactive silica particles as describe above indude MIBK-SD, MIBK-SDMS, MIBK-SDL, and MIBK-SDZL manufactured by Nissan Chemical Industries, Ltd.; and V8802 and V8803 manufactured by JGC C&C.

Additionally, the above-described silica particles may be spherical silica particles but are preferably deformed silica particles. Spherical silica particles may be combined with deformed silica particles. In this specification, the "spherical silica particle" refers to, for example, a spherical or ellipsoidal silica particle, while "deformed silica partide" refers to a silica partide with a randomly rough surface as observed on potato tubers (having an aspect ratio of 1.2 or more and 40 or less when a cross-section is observed). Because the above-described deformed silica particle has a larger surface area than that of a spherical silica partide, the presence of such deformed silica particles increases the contact area with, for example, the above-described polyfunctional (meth)acrylate and can thereby improve the hardness of the above-described hard coat layer. Observation of a cross-section of the hard coat layer under a transmission electron microscope (TEM) or scanning transmission electron microscope (STEM) can determine whether silica particles contained in the hard coat layer are deformed silica particles or not.

The average particle diameter of the above-described silica particles is preferably 5 nm or more and 200 nm or less. Production of silica particles with a particle diameter of less than 5 nm is difficult, and silica particles with such a particle diameter may aggregate each other and, moreover, be hardly deformed. Furthermore, deformed silica particles with such a particle diameter are less dispersible and may aggregate each other in the above-described ink before use for coating. On the other hand, in cases where the above-described deformed silica particles have an average particle diameter of more than 200 nm, problems such as formation of a very rough surface and increase of haze may occur in the hard coat layer. In cases where the silica particles are spherical silica particles, the average particle diameter of the silica particles is defined as the arithmetic mean of the particle diameters of 20 particles, where the particle diameters of the 20 particles are measured from cross-sectional images of particles acquired using a transmission electron microscope (TEM) or scanning transmission electron microscope (STEM). Additionally, in cases where the silica particles are deformed silica particles, the average partide diameter of the silica particles is defined as the arithmetic mean of the partide diameters of 20 particles, which are determined by measuring the maximum (major axis) and minimum (minor axis) values of the distance between two points on the circumference of each particle within a cross-sectional image of the hard coat layer acquired using a transmission electron microscope (TEM) or scanning transmission electron microscope (STEM), averaging the obtained values to determine the diameter of the particle, and repeating the measurement for the 20 particles.

The hardness (Martens hardness) of the first hard coat layer 12B can be controlled by adjusting the size and content of the above-described inorganic particles. For example, in the formation of the first hard coat layer 12B, the above-described silica particles having a diameter of 5 nm or more and 200 nm or less are preferably contained at a concentration of 25 to 60 parts by mass relative to 100 parts by mass of the above-described polymerizable compound.

<Second Hard Coat Layer>

The second hard coat layer 12C is a layer provided to satisfy the requirement of the above-described successive folding test. The second hard coat layer 12C preferably exhibits a Martens hardness of 375 MPa or more and 1500 MPa or less at the center of the cross-section of the second hard coat layer 12C. In cases where the Martens hardness is less than 375 MPa, the hard coat layer may have insufficient abrasion resistance; in cases where the Martens hardness is more than 1500 MPa, the resulting optical film may have insufficient folding resistance and be unable to satisfy the requirement of the above-described successive folding test. The minimum Martens hardness at the center of the cross-section of the second hard coat layer 12C is more preferably 450 MPa or more, while the maximum Martens hardness at the same position is more preferably 575 MPa or less.

The second hard coat layer 12C contains a resin. The second hard coat layer 12C may further contain inorganic particles dispersed in the resin.

(Resin)

The resin comprises a polymerized product (a cured product) of a polymerizable compound (a curable compound). The polymerizable compound is preferably a polyfunctional (meth)acrylate. The above-described polyfunctional (meth)acrylate include the same polyfunctional (meth)acrylates as described for the first hard coat layer 12B. Additionally, the second hard coat layer 12C may comprise, for example, a polyfunctional urethane (meth)acrylate and/or a polyfunctional epoxy (meth)acrylate, in addition to the above-described polyfunctional (meth)acrylate.

(Inorganic Particles)

The inorganic particles include the same types of inorganic particles as described for the first hard coat layer 12B. The content of the inorganic particles in the second hard coat layer 12C is not limited to a particular content but is preferably, for example, 0 to 50% by mass relative to the second hard coat layer 12C.

At least either the first hard coat layer 12B or the second hard coat layer 12C may contain any materials other than the above-described materials to the extent that the above-described Martens hardness is achieved. For example, a material such as a polymerizable monomer or oligomer which forms a cured product upon exposure to ionizing radiation may be additionally contained as a resin component material. As the above-described polymerizable monomer or oligomer, (meth)acrylate monomers or oligomers each containing a radical polymerizable unsaturated group in the molecule are included. Examples of the above-described (meth)acrylate monomers or oligomers each containing a radical polymerizable unsaturated group in molecule include monomers or oligomers of, for example, urethane (meth)acrylate, polyester (meth)acrylate, epoxy (meth)acrylate, melamine (meth)acrylate, polyfluoroalkyl (meth)acrylate, and silicone (meth)acrylate. These polymerizable monomers or oligomers may be used individually or in combination of two or more. Among those monomers or oligomers, a monomer or oligomer of polyfunctional (hexafunctional or higher) urethane (meth)acrylate with a weight average molecular weight of 1,000 to 10,000 is preferred.

The hard coat layer 12 (at least either the first hard coat layer 12B or the second hard coat layer 12C) may further contain an ultraviolet absorber, a spectral transmittance modifier, and/or an antifouling agent.

<Ultraviolet Absorber>

Optical films are particularly suitably used in mobile terminals such as foldable smartphone and tablet terminal, and such mobile terminals are often used outdoors and thus each have a problem that a polarizer located closer to a display element than an optical film is easily degraded by exposure to ultraviolet light. However, in cases where a resin layer placed on the surface of a polarizer facing toward a display screen contains an ultraviolet absorber, the resin layer can advantageously prevent the polarizer from being degraded by exposure to ultraviolet light. The above-described ultraviolet absorber (UVA) may be contained in the resin base material 11 and/or the resin layer 13. In this case, the ultraviolet absorber (UVA) may not be contained in the hard coat layer 12.

Examples of the ultraviolet absorber include triazine-based ultraviolet absorbers, benzophenone-based ultraviolet absorbers, and benzotriazole-based ultraviolet absorbers.

Examples of the above-described triazine-based ultraviolet absorbers include 2-(2-hydroxy-4-[1-octylocarbonylethoxy]phenyl)-4,6-bis(4-phenylphenyl)-1,3,5-triazine, 2-[4-[(2-hydroxy-3-dodecyloxypropyl)oxy]-2-hydroxyphenyl]-4,6-bis(2,4-dimethylphenyl)-1,3,5-triazine, 2,4-bis[2-hydroxy-4-butoxyphenyl]-6-(2,4-dibutoxyphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2-[4-[(2-hydroxy-3-(2'-ethyphel)oxy]-2-hydroxyphenyl]-4,6-bis(2,4-dimethylphenyl)-1,3,5-triazine. Examples of commercially available triazine-based ultraviolet absorbers include Tinuvin 460, Tinuvin 477 (both are manufactured by BASF SE), and LA-46 (manufactured by ADEKA Corporation).

Examples of the above-described benzophenone-based ultraviolet absorbers include 2-hydroxybenzophenone, 2,4-dihydroxybenzophenone, 2,2'-dihydroxy-4,4'-dimethoxybenzophenone, 2,2',4,4'-tetrahydroxybenzophenone, 2-hydroxy-4-methoxybenzophenone, hydroxymethoxybenzophenone sulfonate and its trihydrate, and sodium hydroxymethoxybenzophenone sulfonate. Examples of commercially available benzophenone-based ultraviolet absorbers include CHMASSORB 81/FL (manufactured by BASF SE).

Examples of the above-described benzotriazole-based ultraviolet absorbers include 2-ethylhexyl-3-[3-tert-butyl-4-hydroxy-5-(5-chloro-2H-benzotriazol-2-yl)phenyl]propionate, 2-(2H-benzotriazol-2-yl)-6-(straight chain and side chain dodecyl)-4-methylphenol, 2-[5-chloro(2H)-benzotriazol-2-yl]-4-methyl-6-(tert-butyl)phenol, 2-(2H-benzotriazol-2-yl)-4,6-di-tert-pentylphenol, 2-(2'-hydroxy-5'-methylphenyl)benzotriazole, 2-(2'-hydroxy-3',5'-di-tert-butylphenyl)benzotriazole, 2-(2'-hydroxy-3'-tert-butyl-5'-methylphenyl)benzotriazole, 2-(2'-hydroxy-3',5'-di-tert-butylphenyl)-5-chlorobenzotriazole, 2-(2'-hydroxy-3'-(3", 4",5",6"-tetrahydrophthalimidomethyl)-5'-methylphenyl) benzotriazole, 2,2-methylenebis(4-(1,1,3,3-tetramethylbutyl)-6-(2H-benzotriazol-2-yl)phenol), and 2-(2'-hydroxy-3'-tert-butyl-5'-methylphenyl)-5-chlorobenzotriazole. Examples of commercially available benzotriazole-based ultraviolet absorbers include KEMISORB 71D, KEMISORB 79 (both are manufactured by Chemipro Kasei Kaisha, Ltd.), JF-80, JAST-500 (both are manufactured by Johoku Chemical Co., Ltd.), ULS-1933D (manufactured by Ipposha Oil Industries Co., Ltd.), and RUVA-93 (manufactured by Otsuka Chemical Co., Ltd.).

Among those ultraviolet absorbers, triazine-based and benzotriazole-based ultraviolet absorbers are suitably used. Preferably, the ultraviolet absorber is highly soluble in a resin component which constitutes the hard coat layer, and also bleeds less out from the hard coat layer after the above-described successive folding test. The ultraviolet absorber has preferably been polymerized or oligomerized. As the ultraviolet absorber, polymers or oligomers containing the benzotriazole, triazine, or benzophenone backbone are preferred, specifically including ultraviolet absorbers obtained by thermal copolymerization of a (meth)acrylate containing the benzotriazole or benzophenone backbone and methyl methacrylate (MMA) at an arbitrary ratio. In cases where the optical film is applied to an organic light-emitting diode (OLED) display device, the ultraviolet absorber can play a role in protection of the OLED from ultraviolet light.

The content of the ultraviolet absorber is not limited to a particular amount but is preferably 1 part by mass or more and 6 parts by mass or less relative to 100 parts by mass of solids in the hard coat layer composition. In cases where the content is less than 1 part by mass, the hard coat layer may be allowed to contain only an insufficient amount of the above-described ultraviolet absorber; in cases where the content is more than 6 parts by mass, a marked coloration and a reduction of strength may occur on the hard coat layer. The minimum content of the above-described ultraviolet absorber is more preferably 2 parts by mass or more, while the maximum content of the above-described ultraviolet absorber is more preferably 5 parts by mass or less.

<Spectral Transmittance Modifier>

The spectral transmittance modifier is an agent for modifying the spectral transmittance of an optical film. In cases where the hard coat layer 12 contains, for example, the sesamol type benzotriazole monomer represented by the general formula (25) below, the above-described spectral transmittance can be suitably achieved.

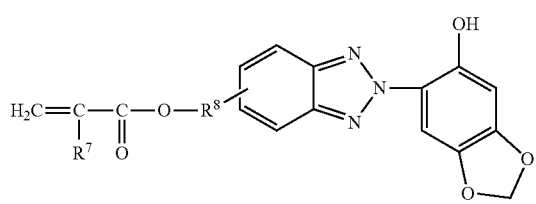

(25)

In the formula, $R^7$ represents a hydrogen atom or methyl group; $R^8$ represents a linear or brandied alkylene or oxyalkylene group having 1 to 6 carbon atoms.

The above-described sesamol type benzotriazole monomer is not limited to a particular sesamol type benzotriazole monomer. Specific examples of the substance can include 2-[2-(6-hydroxybenzo[1,3]dioxol-5-yl)-2H-benzotriazol-5-yl]ethylmethacrylate, 2-[2-(6-hydroxybenzo[1,3]dioxol-5-yl)-2H-benzotriazol-5-yl]ethylacrylate, 3-[2-(6-hydroxybenzo[1,3]dioxol-5-yl)-2H-benzotriazol-5-yl] propylmethacrylate, 3-[2-(6-hydroxybenzo[1,3]dioxol-5-yl)-2H-benzotriazol-5-yl]propylacrylate, 4-[2-(6-hydrobenzo[1,3]dioxol-5-yl)-2H-benzotriazol-5-yl] butylmethacrylate, 4-[2-(6-hydroxybenzo[1,3]dioxol-5-yl)-2H-benzotriazol-5-yl]butylacrylate, 2-[2-(6-hydroxybenzo[1,3]dioxol-5-yl)-2H-benzotriazol-5-yloxy] ethylmethacrylate, 2-[2-(6-hydroxybenzo[1,3]dioxol-5-yl)-2H-benzotriazol-5-yloxy]ethylacrylate, 2-[3-{2-(6-hydrobenzo[1,3]dioxol-5-yl)-2H-benzotriazol-5-yl}propanoyloxy]ethylmethacrylate, 2-[3-{2-(6-hydrobenzo[1,3]dioxol-5-yl)-2H-benzotriazol-5-yl}propanoyloxy]ethylacrylate, 4-[3-{2-(6-hydroxybenzo[1,3]dioxol-5-yl)-2H-benzotriazol-5-yl}propanoyloxy]butylmethacrylate, 4-[3-{2-(6-hydroxybenzo[1,3]dioxol-5-yl)-2H-benzotriazol-5-yl}propanoyloxy]butylacrylate, 2-[3-{2-(6-hydroxybenzo[1,3]dioxol-5-yl)-2H-benzotriazol-5-yl}propanoyloxy]ethylmethacrylate, 2-[3-{2-(6-hydrobenzo[1,3]dioxol-5-yl)-2H-benzotriazol-5-yl}propanoyloxy] ethylacrylate, 2-(methacryloyloxy)ethyl 2-(6-hydroxybenzo[1,3]dioxol-5-yl)-2H-benzotriazole-5-carboxylate, 2-(acryloyloxy)ethyl 2-(6-hydroxybenzo[1,3]dioxol-5-yl)-2H-benzotriazole-5-carboxylate, 4-(methacryloyloxy)butyl 2-(6-hydroxybenzo[1,3]dioxol-5-yl)-2H-benzotriazole-5-carboxylate, and 4-(acryloyloxy)butyl 2-(6-hydroxybenzo[1,3]dioxol-5-yl)-2H-benzotriazole-5-carboxylate. Additionally, these sesamol type benzotriazole monomers may be used individually or in combination of two or more.

The above-described sesamol type benzotriazole monomer may be contained in the resin layer 13, or may be contained in one or more resin layers to fulfill the requirements of the above-described spectral transmittance in cases where the resins layer has a multilayer structure consisting of two or more resin layers. Examples of the multilayer structure indude a configuration in which one of the resin layers contains a sesamol type benzotriazole monomer as described above that can achieve the spectral transmission at a wavelength of 380 nm and another resin layer contain sesamol type benzotriazole monomers as described above that can achieve the conditions of spectral transmission at wavelengths of 410 nm and 440 nm. Furthermore, the multilayer structure may be composed of three or more resin layers, each of which contains a sesamol type benzotriazole monomer as described above to fulfill the requirements of the above-described spectral transmittance.

In cases were the above-described sesamol type benzotriazole monomer is contained in the resin layer 13, the above-described sesamol type benzotriazole monomer is preferably contained in the resin layer 13, for example, at a concentration of 15 to 30% by mass. The presence of the sesamol type benzotriazole monomer in such a content range allows the resin layer to achieve the above-described spectral transmittance. In the resin layer 13, the above-described sesamol type benzotriazole monomer may react with a resin component which constitutes the resin layer 13 to be contained as an integrated part of the resulting compound, or may not react with a resin component that composes the resin layer 13 to be contained individually.

<Antifouling Agent>

The antifouling agent may be evenly distributed in the hard coat layer, but is preferably unevenly distributed toward the surface of the hard coat layer to attain a sufficient antifouling effect with a small added amount of the antifouling agent and to prevent the hard coat layer from reducing the strength. Examples of a method of unevenly distributing an antifouling agent toward the surface of a hard coat layer in cases where the hard coat layer has a monolayer structure include a method in which a coating film formed using a hard coat layer composition is dried and then heated before curing in the formation of a hard coat layer to reduce the viscosity of a resin component contained in the coating film, and thereby to increase the flowability of an antifouling agent, and consequently to distribute the antifouling agent unevenly toward the surface of the hard coat layer; and a method in which an antifouling agent with a low surface tension is chosen for use and a coating film is dried without heating to raise the antifouling agent to the surface of the coating film and the coating film is then cured to distribute the above-described antifouling agent unevenly toward the uppermost surface of the resulting hard coat layer. Additionally, in cases where a hard coat layer has a multilayer structure as in the hard coat layer 12, an antifouling agent can be unevenly distributed toward the surface of the hard coat layer by adding the antifouling agent to a hard coat sublayer close to the uppermost surface.

Examples of the antifouling agent include, but are not limited to, silicone-based antifouling agents, fluorine-based antifouling agents, and silicone- and fluorine-based antifouling agents; those antifouling agents may be used individually or in combination. Additionally, the antifouling agent may be an acrylic antifouling agent.

The content of the antifouling agent is preferably from 0.01 to 3.0 parts by mass relative to 100 parts by mass of the above-described resin component. In cases where the content is less than 0.01 parts by mass, the resin layer may not be allowed to attain a sufficient antifouling effect; additionally, in cases where the content is more than 3.0 parts by mass, the hard coat layer is likely to have reduced hardness.

The antifouling agent is a compound having preferably a weight average molecular weight of 5000 or less and containing preferably one or more, more preferably two or more, reactive functional groups to improve the durability of antifouling effect. Among those antifouling agents, an antifouling agent containing two or more reactive functional groups can be used to provide excellent abrasion resistance.

In cases where the antifouling agent has no reactive functional group and the resulting optical film sheet is rolled or piled up, the antifouling agent moves toward the back surface of the optical film, which may cause separation of a layer of the optical film from another layer of the optical film and, furthermore, may cause separation of the layers after multiple repetition of the successive folding test when one of the layers is laminated or applied to the back surface of the other.

Furthermore, the above-described antifouling agent containing a reactive functional group exhibits a durable antifouling effect, and a hard coat layer containing the above-described fluorine-based antifouling agent, among others, is fingerprint resistant (rendering fingerprints invisible) and also makes it easy to wipe off fingerprints. Furthermore, the above-described silicone-based antifouling agent can reduce the surface tension generated during coating of a hard coat layer composition, which increases the leveling performance and assists in formation of a hard coat layer with a desirable appearance.

A hard coat layer containing a silicone-based antifouling agent has high smoothness and strong resistance against scratching with steel wool. An optical film having a hard coat layer that contains such a silicone-based antifouling agent provides smooth touch to a touch sensor covered with the optical film, and then offers a better tactile feeling when the touch sensor is touched with a finger or pen. Additionally, the hard coat layer is fingerprint resistant (rendering fingerprints invisible) and also makes it easy to wipe off fingerprints. Furthermore, the above-described silicone-based antifouling agent can reduce the surface tension generated during coating of a hard coat layer composition, which increases the leveling performance and assists in formation of a hard coat layer with a desirable appearance.

Examples of commercially available silicone-based antifouling agents include SUA1900L10 (manufactured by Shin-Nakamura Chemical Co., Ltd.), SUA1900L6 (manufactured by Shin-Nakamura Chemical Co., Ltd.), Ebecryl 1360 (manufactured by Daicel-Cytec Ltd.), UT3971 (manufactured by The Nippon Synthetic Chemical Industry Co., Ltd.), BYKUV3500 (manufactured by BYK Japan KK), BYKUV3510 (manufactured by BYK Japan KK), BYKUV3570 (manufactured by BYK Japan KK), X22-164E, X22-174BX, X22-2426, KBM503, KBM5103 (manufactured by Shin-Etsu Chemical Co., Ltd.), TEGO-RAD2250, TEGO-RAD2300, TEGO-RAD2200N, TEGO-RAD2010, TEGO-RAD2500, TEGO-RAD2600, TEGO-RAD2700 (manufactured by Evonik Japan Co., Ltd.), and MEGAFACE RS854 (manufactured by DIC Corporation).

Examples of commercially available fluorine-based antifouling agents include OPTOOL DAC, OPTOOL DSX (manufactured by Daikin Industries, Ltd.), MEGAFACE RS-71, MEGAFACE RS-74 (manufactured by DIC Corporation), LINC152EPA, LINC151EPA, LINC182UA (manufactured by Kyoeisha Chemical Co., Ltd.), FUTARGENT 650A, FUTARGENT 601AD, and FUTARGENT 602.

Examples of commercially available fluorine- and silicone-based antifouling agents containing a reactive functional group include MEGAFACE RS-851, MEGAFACE RS-852, MEGAFACE RS-853, MEGAFACE RS-854 (manufactured by DIC Corporation), OPSTAR TU2225, OPSTAR TU2224 (manufactured by JSR Corporation), and X71-1203M (manufactured by Shin-Etsu Chemical Co., Ltd.).

<<Resin Layer>>

The resin layer 13 is a layer containing a light-transmitting resin. The resin layer 13 is a layer with impact absorbency. The resin layer may have a multilayer structure composed of two or more resin layers.

The resin layer 13 has a film thickness of 50 μm or more and 300 μm or less. In cases where the resin layer has a film thickness of less than 50 μm, the resin layer 13 is likely to have reduced hardness; additionally, in cases where the resin layer has a film thickness of more than 300 μm, the resin layer has an excessively thick film thickness and is thus not suitable for thickness reduction and is likely to reduce the processing properties. The film thickness of the resin layer is defined as the arithmetic mean of film thickness values measured at 20 different locations, where a cross-section of the resin layer is imaged using a scanning electron microscope (SEM) and the film thickness of the resin layer is measured at the 20 locations within the image of the cross-section. The method of acquiring cross-sectional images of the resin layer is the same as the method of acquiring cross-sectional images of the hard coat layer. The lower limit of the resin layer 13 is more preferably 60 μm or more in thickness, while the upper limit of the resin layer 13 is more preferably 150 μm or less, further preferably 100 μm or less, in thickness.

The resin as a component of the resin layer 13 is not limited to a particular resin as long as the resin allows the resulting optical film 10 to have a shear storage modulus (G') and a shear loss modulus (G") within the above-described ranges at 25° C. in the frequency range from 500 Hz to 1000 Hz inclusive. Examples of such a resin include acrylic gels, urethane-based gels, silicone-based gels, urethane resins, and epoxy resins. Among those resins, acrylic gels are preferred. The "gel" generally refers to a disperse system with high viscosity and no fluidity. Additionally, the resin layer 13 may contain a rubber or a thermoplastic elastomer in addition to, for example, an acrylic gel or a urethane resin.

(Acrylic Gel)

Various acrylic gels can be used as long as those acrylic gels are polymers produced by polymerization of monomers containing acrylic esters used in, for example, adhesives. Specifically, an acrylic gel obtained by polymerization or copolymerization of an acrylic monomer, such as ethyl (meth)acrylate, n-propyl (meth)acrylate, i-propyl (meth)acrylate, n-butyl (meth)acrylate, i-butyl (meth)acrylate, 2-ethylhexyl (meth)acrylate, n-hexyl (meth)acrylate, n-amyl (meth)acrylate, i-amyl (meth)acrylate, octyl (meth)acrylate, i-octyl (meth)acrylate, i-myristyl (meth)acrylate, lauryl (meth)acrylate, nonyl (meth)acrylate, i-nonyl (meth)acrylate, i-decyl (meth)acrylate, tridecyl (meth)acrylate, stearyl (meth)acrylate, or i-stearyl (meth)acrylate, can be used as the acrylic gel. In this specification, both "acrylate" and "methacrylate" are meant by the word "(meth)acrylate." The above-described acrylic esters used for the (co)polymerization may be used individually or in combination of two or more.

(Urethane Resin)

The urethane resin is a resin having urethane linkages. Examples of the urethane resin include a cured product of an ionizing radiation-curable urethane resin composition and a cured product of a thermosetting urethane resin composition. The urethane resin is preferably a cured product of an ionizing radiation-curable urethane resin composition, among those urethane resin compositions, because the cured product provides high hardness and is also highly mass-producible due to the fast cure rate.

The ionizing radiation-curable urethane resin composition contains urethane (meth)acrylate, while the thermosetting urethane resin contains a polyol compound and an isocyanate compound. The urethane (meth)acrylate, the polyol compound, and the isocyanate compound may each be a monomer, oligomer, or prepolymer.

The number of (meth)acryloyl groups (number of functional groups) in the urethane (meth)acrylate is preferably 2 or more and 4 or less. In cases where the number of (meth)acryloyl groups in the urethane (meth)acrylate is less than 2, the optical film is likely to have a lower level of pencil hardness; additionally, in cases where the number of (meth)acryloyl groups in the urethane (meth)acrylate is more than 4, the optical film is curled due to high cure shrinkage and is also likely to be cracked in the resin layer when being folded. The maximum number of (meth)acryloyl groups in the urethane (meth)acrylate is more preferably 3 or less. Both "acryloyl group" and "methacryloyl group" are meant by the word "(meth)acryloyl group."

The weight average molecular weight of the urethane (meth)acrylate is preferably 1,500 or more and 20,000 or less. In cases where the weight average molecular weight of the urethane (meth)acrylate is less than 1,500, the optical film is likely to have a reduced impact resistance; additionally, in cases where the weight average molecular weight of the urethane (meth)acrylate is more than 20,000, the ionizing radiation-curable urethane resin composition is likely to have an increased viscosity and result in reduced coating performance. The lower limit of weight average molecular weight of the urethane (meth)acrylate is more preferably 2,000 or more, while the upper limit of weight average molecular weight of the urethane (meth)acrylate is more preferably 15,000 or less.

Additionally, examples of the repeating unit having a structure derived from urethane (meth)acrylate include structures represented by the general formulae (26), (27), (28), and (29).

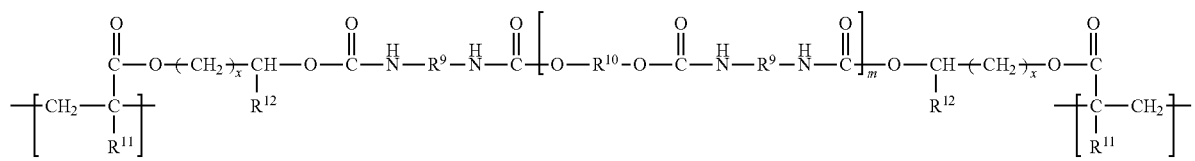

(26)

In the above-described general formula (26), $R^9$ represents a branched alkyl group; $R^{19}$ represents a branched alkyl group or a saturated alicyclic group; $R^{11}$ represents a hydrogen atom or methyl group; $R^{12}$ represents a hydrogen atom, methyl group, or ethyl group; m represents an integer of 0 or more; x represents an integer of 0 to 3.

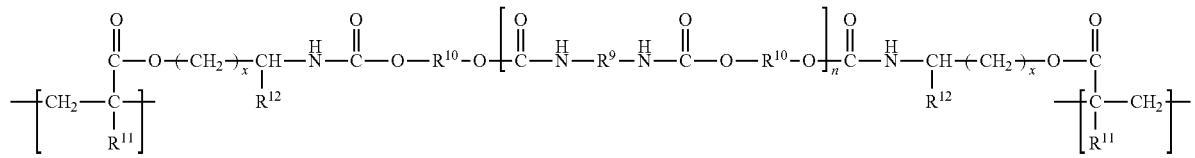

(27)

In the above-described general formula (27), $R^9$ represents a branched alkyl group; $R^{10}$ represents a branched alkyl group or a saturated alicyclic group; $R^{11}$ represents a hydrogen atom or methyl group; $R^{12}$ represents a hydrogen atom, methyl group, or ethyl group; n represents an integer of 1 or more; x represents an integer of 0 to 3.

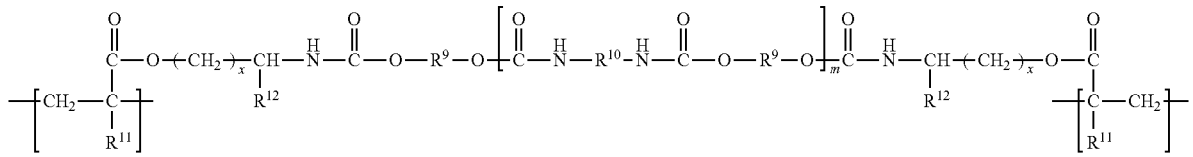

(28)

In the above-described general formula (28), $R^9$ represents a branched alkyl group; $R^{10}$ represents a branched alkyl group or a saturated alicyclic group; $R^{11}$ represents a hydrogen atom or methyl group; $R^{12}$ represents a hydrogen atom, methyl group, or ethyl group; m represents an integer of 0 or more; x represents an integer of 0 to 3.

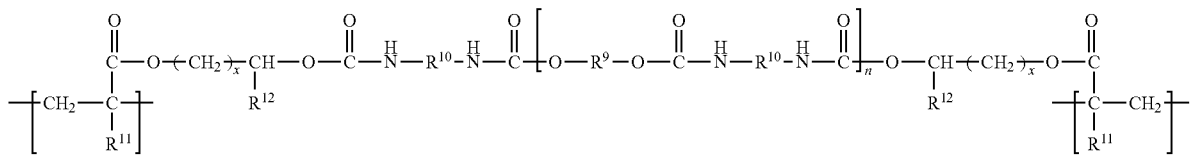

(29)

In the above-described general formula (29), $R^9$ represents a branched alkyl group; $R^{10}$ represents a branched alkyl group or a saturated alicyclic group; $R^{11}$ represents a hydrogen atom or methyl group; $R^{12}$ represents a hydrogen atom, methyl group, or ethyl group; n represents an integer of 1 or more; x represents an integer of 0 to 3.

Analysis of the resin layer 13 by, for example, pyrolysis GC-MS and FT-IR can determine the structure (repeating unit) of a polymer that forms the constituent resin of the resin layer 13. Particularly, pyrolysis GC-MS is so useful that monomer components contained in the resin layer 13 can be detected and identified.

The resin layer 13 may contain, for example, an ultraviolet absorber, a spectral transmittance modifier, an antifouling agent, inorganic particles, and/or organic particles as long as the resin layer allows the resulting optical film 10 to have a shear storage modulus (G') and a shear loss modulus (G") within the above-described ranges at 25° C. in the frequency range from 500 Hz to 1000 Hz inclusive. The additional components such as ultraviolet absorber described for the hard coat layer 12 can be used as the additional components such as ultraviolet absorber, and the description thereof is thus omitted here.

<<<Additional Optical Film>>>

In the optical film 10 shown in FIG. 1, the resin layer 13 is directly provided on the second surface 11B of the resin base material 11. However, an optical film may comprise a rein layer laminated to a resin base material through an adhesive layer. Specifically, the optical film 40 shown in FIG. 5 comprises a resin base material 11, a hard coat layer 12 provided on the first surface 11A of the resin base material 11, a resin layer 13 provided on the second surface 11B of the resin base material 11 that is opposite to the first surface 11A, and an adhesive layer 41 provided along the interface between the resin base material 11 and the resin layer 13. The resin layer 13 is laminated to the resin base material 11 through the adhesive layer 41. In FIG. 5, the elements indicated by the same reference numbers as in FIG. 1 are the same as those indicated in FIG. 1, and further description is thus omitted.

In FIG. 5, the surface 40A of the optical film 40 corresponds to the surface 12A of the hard coat layer 12. The back surface 40B of the optical film 40 corresponds to the surface 13A opposite to the surface of the resin layer 13 side in the resin base material 11.

Also in the optical film 40, the shear storage modulus (G') at 25° C. in the frequency range from 500 Hz to 1000 Hz inclusive is more than 200 MPa and 1200 MPa or less, and the shear loss modulus (G") at 25° C. in the frequency range from 500 Hz to 1000 Hz inclusive is 3 MPa or more and 150 MPa or less. The shear storage modulus (G') and shear loss modulus (G") of the optical film 40 should be measured by the same method as for the shear storage modulus (G') and shear loss modulus (G") of the optical film 10. Other physical properties of the optical film 40 are the same as those of the optical film 10, and the description thereof is thus omitted here.

<<Adhesive Layer>>

The adhesive layer 41 may be an adhesive film. As the adhesive layer 41, for example, an OCA (optical clear adhesive) can be used, though not particularly limited thereto. The adhesive layer 41 preferably has a film thickness of 5 μm or more. With the adhesive layer 41 having a film thickness of 5 μm or more, the resin layer 13 can be securely laminated to the resin base material 11. The lower limit of the film thickness in the adhesive layer 41 preferably is 50 μm or less in view of making an optical film thinner.

<<Optical Film Production Method>>

The optical film 10 can be produced by various methods according to the type of a resin as a component of the resin layer 13. For example, in cases where the resin layer 13 is a layer containing an acrylic gel, the resin layer can be produced, for example, as follows. First, a first hard coat layer composition is applied on the first surface 11A of the resin base material 11 by a coating apparatus such as bar coater to form a coating film of the first hard coat layer composition.

<First Hard Coat Layer Composition>

The first hard coat layer composition contains a polymerizable compound for forming the first hard coat layer 12B. The first hard coat layer composition may additionally contain an ultraviolet absorber, a spectral transmittance modifier, an antifouling agent, inorganic particles, a leveling agent, a solvent, and a polymerization initiator, as necessary.

(Solvent)

Examples of the above-described solvent include alcohols (for example, methanol, ethanol, propanol, isopropanol, n-butanol, s-butanol, t-butanol, benzyl alcohol, PGME, ethylene glycol, diacetone alcohol), ketones (for example, acetone, methyl ethyl ketone, methyl isobutyl ketone, cydopentanone, cyclohexanone, heptanone, diisobutyl ketone, diethyl ketone, diacetone alcohol), esters (methyl acetate, ethyl acetate, butyl acetate, n-propyl acetate, isopropyl acetate, methyl formate, PGMEA), aliphatic hydrocarbons (for example, hexane, cydohexane), halogenated hydrocarbons (for example, methylene chloride, chloroform, carbon tetrachloride), aromatic hydrocarbons (for example, benzene, toluene, xylene), amides (for example, dimethylformamide, dimethylacetamide, N-methylpyrrolidone), ethers (for example, diethyl ether, dioxane, tetrahydrofurane), ether alcohols (for example, 1-methoxy-2-propanol), and carbonates (dimethyl carbonate, diethyl carbonate, ethylmethyl carbonate). These solvents may be used individually or in combination of two or more. Among those solvents, methyl isobutyl ketone and methyl ethyl ketone are preferred as the above-described solvent in terms of the ability to dissolve or disperse components such as urethane (meth)acrylate and other additives, whereby the first hard coat layer composition can be suitably applied.

(Polymerization Initiator)

The polymerization initiator is a component which degrades, when exposed to ionizing radiation, and generates radicals to initiate or promote polymerization (cross-linking) of a polymerizable compound.

The polymerization initiator is not limited to a particular polymerization initiator as long as a substance that initiates a radical polymerization can be generated by exposure to ionizing radiation. Any known polymerization initiator can be used without any particular limitation, and specific examples include acetophenones, benzophenones, Michler's benzoyl benzoate, α-amyloxime esters, thioxantones, propyophenones, benzyls, benzoins, and acylphosphine oxides. Additionally, a photosensitizer is preferably mixed for use, and specific examples of the photosensitizer include n-butylamine, triethylamine, and poly-n-butylphosphine.

After the coating film of the first hard coat layer composition is formed, the coating film is heated at a temperature of, for example, 30° C. or higher and 120° C. or lower for a period of 10 to 120 seconds by various known techniques to dry and evaporate the solvent.

After drying the coating film, the coating film is exposed to ionizing radiation such as ultraviolet light to semi-cure (half cure) the coating film. The term "semi-cured" as used herein means that curing substantially proceeds upon further exposure to ionizing radiation. However, the coating film may be completely cured (full-cured) at this step. The phrase "completely cured" as used herein means that curing substantially no more proceeds in spite of further exposure to ionizing radiation.

After the coating film is semi-cured, a second hard coat layer composition to form the second hard coat layer 12C is applied on the coating film by a coating apparatus such as bar coater to form a coating film of the second hard coat layer composition.

<Second Hard Coat Layer Composition>

The second hard coat layer composition contains a polymerizable compound for forming the second hard coat layer 12C. The second hard coat layer composition may additionally contain an ultraviolet absorber, a solvent, and a polymerization initiator, as necessary. The content of total solids in the second hard coat layer composition is preferably from 25 to 55%, similarly to the first hard coat layer composition. The solvent and the polymerization initiator are the same as those described for the first hard coat layer composition, and the description thereof is thus omitted here.

After the coating film of the second hard coat layer composition is formed, the coating film is heated at a temperature of, for example, 30° C. or higher and 120° C. or lower for a period of 10 to 120 seconds by various known techniques to dry and evaporate the solvent.

After drying the coating film, the coating film of the second hard coat layer composition is exposed to ionizing radiation such as ultraviolet light to completely cure (full-cure) the first and second hard coat layer compositions for the formation of the first hard coat layer 12B and the second hard coat layer 12C, and the hard coat layer 12 is thereby obtained. Subsequently, a resin layer composition is applied on the second surface 11B of the resin base material 11 with the formed hard coat layer 12 to form a coating film of the resin layer composition.

<Resin Layer Composition>

The resin layer composition contains, for example, urethane (meth)acrylate or the like. The resin layer composition may additionally contain an ultraviolet absorber, a spectral transmittance modifier, a leveling agent, a solvent, and a polymerization initiator, as necessary. Solvents and polymerization initiators similar to those described for the first hard coat layer composition can be used.

After the coating film of the resin composition is formed, the coating film is dried and then exposed to ionizing radiation to cure the coat film of the resin layer composition and thereby to form the resin layer 13. Consequently, the optical film 10 shown in FIG. 1 is obtained.

Additionally, in cases where the optical film 40 shown in FIG. 5 is obtained, the hard coat layer 12 is first formed on the first surface 11A of the resin base material 11 in the same manner as described above.

Meanwhile, a resin layer composition is applied on one surface of a mold release film such as a polyethylene terephthalate film to form a coating film, which is dried and then exposed to ionizing radiation to cure the coating film of the resin layer composition and thereby to form the resin layer 13.

After the resin layer 13 is formed on the mold release film, the mold release film is peeled off from the resin layer 13 to obtain a simple resin layer 13. Then, the obtained resin layer 13 is laminated to the second surface 11B of the resin base material 11 through the adhesive layer 41. Consequently, the optical film 40 shown in FIG. 5 is obtained.

<<<Image Display Device>>>

Figure 6:
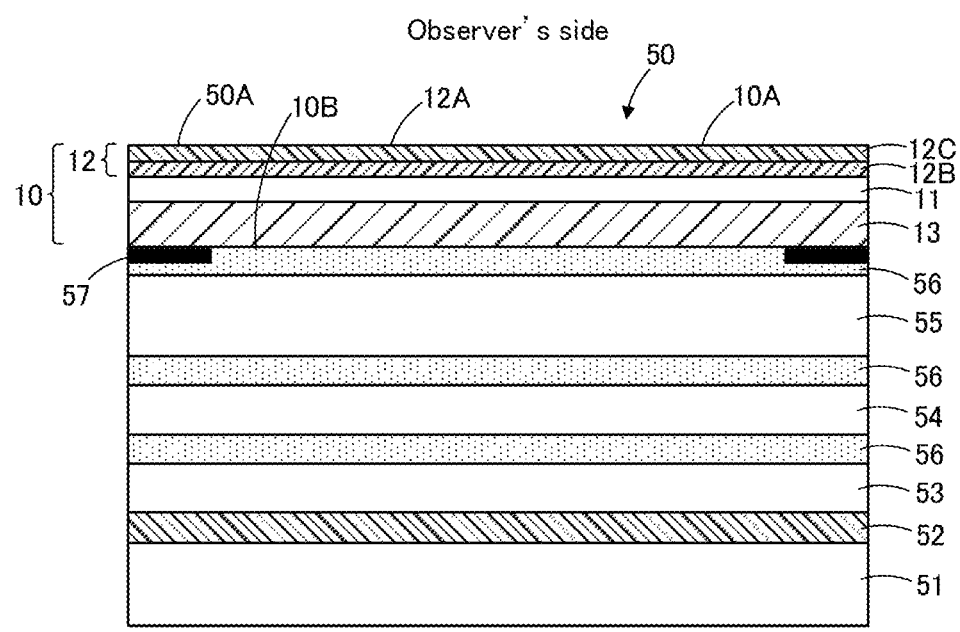
FIG. 6 depicts the schematic diagram of an image display device according to an embodiment.

The optical film 10 or 40 may be incorporated into a foldable image display device and then used. FIG. 6 depicts the schematic diagram of the image display device according to the present embodiment. As shown in FIG. 6, a housing 51 in which a battery or the like is accommodated, a protective film 52, a display panel 53, a touch sensor 54, a circularly polarizing plate 55, and the optical film 10 are generally laminated together in the image display device 50 in the recited order toward the observer. Light-transmitting adhesive layers 56 are placed along the interfaces between the display panel 53 and the touch sensor 54, between the touch sensor 54 and the circularly polarizing plate 55, and between the circularly polarizing plate 55 and the optical film 10, and these elements are anchored to each other with the adhesive layers 56. Additionally, a black layer 57 is provided on a portion of the back surface 10B of the optical film 10. Although the adhesive layers 56 are placed along the interfaces between the display panel 53 and the touch sensor 54, between the touch sensor 54 and the circularly polarizing plate 55, and between the circularly polarizing plate 55 and the optical film 10, the locations of the adhesive layers are not limited to particular locations as long as those locations are in the space between the optical film and the display panel.

In the optical film 10, the hard coat layer 12 is located on the observers side of the resin base material 11. For the image display device 50, the surface 12A of the hard coat layer 12 (the surface of the second hard coat layer 12C) in the optical film 10 is configured to be the surface 50A of the image display device 50.

In the image display device 50, the display panel 53 is an organic light-emitting diode panel containing, for example, an organic light-emitting diode. The touch sensor 54 is located closer to the display panel 53 than the circularly polarizing plate 55 but may be placed between the circularly polarizing plate 55 and the optical film 10. Additionally, the touch sensor 54 may be an on-cell type or an in-cell type.

Although, for example, an OCA (optical clear adhesive) can be used for the adhesive layers 56, an adhesive layer containing the above-described acrylic gel is preferably used in view of increasing the impact resistance to prevent damage of the display panel 53. In cases where an adhesive layer containing the above-described acrylic gel is used for the adhesive layers 56, the above-described adhesive layer may be placed along at least any of the interfaces between the display panel 53 and the touch sensor 54, between the touch sensor 54 and the circularly polarizing plate 55, and between the circularly polarizing plate 55 and the optical film 10. Additionally, in cases where the resin layer 13 is containing the above-described acrylic gel, the circularly polarizing plate 55 can be anchored to the optical film 10 not by providing the adhesive layers 56 along the interface between the circularly polarizing plate 55 and the optical film 10, but by directly laminating the resin layer 13 to the circularly polarizing plate 55, because the above-described acrylic gel is adhesive.

The shear loss tangent (tan δ) is conventionally known as an index representing the impact-absorbing capacity. Thus, the impact resistance of an optical film configured to comprise a hard coat layer on one surface and a resin layer on the other surface of a resin base material may be expressed by a value of shear loss tangent (tan δ). However, when an impact was applied to the surface of the optical film (the surface of the hard coat layer), the optical film failed to control depression on the surface of the optical film attributed to the optical film itself and to the adhesive layer and damage to a member located interior to the optical film in an image display device on the basis of a value of the shear loss tangent (tan δ). This is considered to be related to the fact that the shear loss tangent (tan δ) is the ratio (G"/G') between the shear loss modulus (G") and the shear storage modulus (G'). The inventors intensively studied further and consequently found that the balance between the film thickness of the resin layer, the shear storage modulus (G'), and the shear loss modulus (G") is critical to inhibit depression on the surface of the optical film attributed to the optical film itself and to the adhesive layer and damage to a member located interior to the optical film in an image display device when an impact is applied to the surface of the optical film. In the optical films 10 and 40 configured to comprise the hard coat layer 12 on the first surface 11A and the resin layer 13 on the second surface 11B of the resin base material 11 according to the present embodiment, the resin layer 13 has a thin film thickness of 50 μm or more and 300 μm or less, and the above-described shear storage modulus (G') of the optical film 10 or 40 is more than 200 MPa and 1000 MPa or less, and the above-described shear loss modulus (G") of the optical film 10 or 40 is 3 MPa or more and 150 MPa or less. Thus, the optical films 10 and 40 can be folded, as well as can inhibit depression on the surfaces 10A and 40A attributed to the optical films 10 and 40 themselves and to the adhesive layers 56 located interior to the optical film 10 in the image display device 50 and damage to members, such as the display panel 53, located inside of the image display device 50 when an impact is applied to the surface 10A of the optical film 10. Consequently, an excellent impact resistance can be achieved.

EXAMPLES

Now, the present invention will be described in more detail by way of examples. However, the present invention is not limited to those examples. The phrase "a converted value based on 100% solids" below means a value determined based on the assumption that the content of solids diluted in a solvent is 100%.

<Preparation of Hard Coat Layer Compositions>

First, the following components were combined to meet the composition requirements indicated below and thereby to obtain hard coat layer compositions.

(Hard Coat Layer Composition 1)

A mixture of dipentaerythritol pentaacrylate and dipentaerythritol hexaacrylate (product name "M403"; manufactured by Toagosei Co., Ltd.): 25 parts by mass;

EO-modified dipentaerythritol hexaacrylate (product name "A-DPH-6E"; manufactured by Shin-Nakamura Chemical Co., Ltd.): 25 parts by mass;

Deformed silica particles (with an average partide diameter of 25 nm; manufactured by JGC C&C): 50 parts by mass (a converted value based on 100% solids);

Photopolymerization initiator (1-hydrocyclohexyl phenyl ketone; product name "Irgacure®184", manufactured by BASF Japan Ltd.): 4 parts by mass;

Fluorine-based leveling agent (product name "F568"; manufactured by DIC Corporation): 0.2 parts by mass (a converted value based on 100% solids);

Methyl isobutyl ketone (MIBK): 150 parts by mass.

(Hard Coat Layer Composition 2)

Urethane acrylate (product name "UX5000"; manufactured by Nippon Kayaku Co., Ltd.): 25 parts by mass;

A mixture of dipentaerythritol pentaacrylate and dipentaerythritol hexaacrylate (product name "M403"; manufactured by Toagosei Co., Ltd.): 50 parts by mass;

Polyfunctional acrylate polymer (product name "Acrit 8KX-012C"; manufactured by Taisei Fine Chemical Co., Ltd.): 25 parts by mass (a converted value based on 100% solids);

Antifouling agent (product name "BYK-UV 3500"; manufactured by BYK Japan KK): 1.5 parts by mass (a converted value based on 100% solids);

Photopolymerization initiator (1-hydroxycyclohexyl phenyl ketone; product name "Irgacure®184", manufactured by BASF Japan Ltd.): 4 parts by mass;

Methyl isobutyl ketone (MIBK): 150 parts by mass.

<Preparation of Resin Layer Compositions>

First, the following components were combined to meet the composition requirements indicated below and thereby to obtain resin layer compositions.

(Resin Layer Composition 1)

Urethane acrylate (product name "UV3310B", manufactured by The Nippon Synthetic Chemical Industry Co., Ltd.; bifunctional): 85 parts by mass;

Phenoxyethyl acrylate (product name "Viscoat #192", manufactured by Osaka Organic Chemical Industry Ltd.): 5 parts by mass;

A mixture of tripentaerythritol acrylate, mono- and di-pentaerythritol acrylate, and polypentaerythritol acrylate (product name "Viscoat #802"; manufactured by Osaka Organic Chemical Industry Ltd.): 10 parts by mass;

Polymerization initiator (1-hydrocydohexyl phenyl ketone; product name "Irgacure®184", manufactured by BASF Japan Ltd.): 5 parts by mass;

Methyl isobutyl ketone: 10 parts by mass.

(Resin Layer Composition 2)

Urethane acrylate (product name "UV3310B", manufactured by The Nippon Synthetic Chemical Industry Co., Ltd.; bifunctional): 85 parts by mass;

Phenoxyethyl acrylate (product name "Viscoat #192", manufactured by Osaka Organic Chemical Industry Ltd.): 15 parts by mass;

Polymerization initiator (1-hydroxycyclohexyl phenyl ketone; product name "Irgacure®184", manufactured by BASF Japan Ltd.): 5 parts by mass;

Methyl isobutyl ketone: 10 parts by mass.

(Resin Layer Composition 3)

Urethane acrylate (product name "UV3310B", manufactured by The Nippon Synthetic Chemical Industry Co., Ltd.; bifunctional): 80 parts by mass;

Phenoxyethyl acrylate (product name "Viscoat #192", manufactured by Osaka Organic Chemical Industry Ltd.): 5 parts by mass;

A mixture of tripentaerythritol acrylate, mono- and di-pentaerythritol acrylate, and polypentaerythritol acrylate (product name "Viscoat #802"; manufactured by Osaka Organic Chemical Industry Ltd.): 10 parts by mass;

A mixture of dipentaerythritol pentaacrylate and dipentaerythritol hexaacrylate (product name "KAYARAD DPHA"; manufactured by Nippon Kayaku Co., Ltd.): 5 parts by mass;

Polymerization initiator (1-hydroxycyclohexyl phenyl ketone; product name "Irgacure®184", manufactured by BASF Japan Ltd.): 5 parts by mass;

Methyl isobutyl ketone: 10 parts by mass.

(Resin Layer Composition 4)

Urethane acrylate (product name "UV3310B", manufactured by The Nippon Synthetic Chemical Industry Co., Ltd.; bifunctional): 95 parts by mass;

Phenoxyethyl acrylate (product name "Viscoat #192", manufactured by Osaka Organic Chemical Industry Ltd.): 5 parts by mass;

Polymerization initiator (1-hydroxycyclohexyl phenyl ketone; product name "Irgacure®184", manufactured by BASF Japan Ltd.): 5 parts by mass;

Methyl isobutyl ketone: 10 parts by mass.

(Resin Layer Composition 5)

Urethane acrylate (product name "UV3310B", manufactured by The Nippon Synthetic Chemical Industry Co., Ltd.; bifunctional): 85 parts by mass;

A mixture of dipentaerythritol pentaacrylate and dipentaerythritol hexaacrylate (product name "KAYARAD DPHA"; manufactured by Nippon Kayaku Co., Ltd.): 15 parts by mass;

Polymerization initiator (1-hydroxycyclohexyl phenyl ketone; product name "Irgacure®184", manufactured by BASF Japan Ltd.): 5 parts by mass;

Methyl isobutyl ketone: 10 parts by mass.

Example 1

A polyimide base material having a thickness of 50 μm (product name "Neopulim"; manufactured by Mitsubishi Gas Chemical Company, Inc.) was prepared as a resin base material, and the hard coat layer composition 1 was applied on one surface of the polyimide base material, considered as a first surface, by bar coater to form a coating film. Then, the formed coating film was heated at 70° C. for 1 minute to evaporate the solvent in the coating film, and was then exposed to ultraviolet light to an integrated light amount of 100 mJ/cm$^2$ in the air with an ultraviolet irradiation device (with an H bulb as a light source; manufactured by Fusion UV Systems Inc.) to obtain a semi-cured (half cured) coating film. Next, the hard coat layer composition 2 was applied on the surface of the semi-cured coating film of the hard coat layer composition 1 by a bar coater to form a coating film. The formed coating film was heated at 70° C. for 1 minute to evaporate the solvent in the coating film, and was then exposed to ultraviolet light to an integrated light amount of 200 mJ/cm$^2$ under an oxygen concentration of 200 ppm or lower with an ultraviolet irradiation device (with an H bulb as a light source; manufactured by Fusion UV Systems Inc.) to obtain completely cured (full-cured) coating films. Thus, a hard coat layer comprising a first hard coat layer having a film thickness of 10 μm on the polyimide base material and a second hard coat layer having a film thickness of 5 μm and laminated to the first hard coat layer was formed. After the hard coat layer was formed on the polyimide base material, the resin layer composition 1 was applied on a second surface of the polyimide base material, which was opposite to the first surface, by a bar coater to form a coating film. Then, the formed coating film was heated at 70° C. for 1 minute to evaporate the solvent in the coating film, and was then exposed to ultraviolet light to an integrated light amount of 1200 mJ/cm$^2$ in the air with an ultraviolet irradiation device (with an H bulb as a light source; manufactured by Fusion UV Systems Inc.) to cure the coating film and thereby to form a resin layer having a film thickness of 200 μm and containing the urethane resin, and consequently to obtain an optical film.

The film thickness of each layer was defined as the arithmetic mean of the film thickness values measured at 20 different locations, where a cross-section of the layer of interest was imaged using a scanning electron microscope (SEM) and the film thickness of the layer was measured at the 20 locations within the image of the cross-section. Specifically, the method of acquiring cross-sectional images was as follows. First of all, a piece of 1 mm×10 mm cut from the optical film is embedded in an embedding resin to prepare a block, and homogeneous sections having a thickness of 70 nm or more and 100 nm or less and having no openings or the like were sliced from the block according to a commonly used sectioning technique. For the preparation of sections, an "Ultramicrotome EM UC7" (Leica Microsystems GmbH) or the like was used. Then, the block remaining after slicing the sections was used as a measurement sample. Subsequently, cross-sectional images of the measurement sample were acquired using a scanning electron microscope (SEM) (product name "S-4800"; manufactured by Hitachi High-Technologies Corporation). The cross-sectional images were acquired using the above-described S-4800 by setting the detector to "SE," the accelerating voltage to "5 kV," and the emission current to "10 μA." The focus, contrast, and brightness were appropriately adjusted at a magnification of 100 to 100,000 times, so that each layer can be identified by observation. Furthermore, the beam monitor aperture, the objective lens aperture, and the WD were set to "3," "3," and "8 mm," respectively. Additionally, the thickness of the polyimide base material was also measured by the same method as for the film thickness of each layer described above. Also in Examples 2 to 6 and Comparative Examples 1 to 5, the thickness of a base material, and the film thicknesses of a hard coat layer and a resin layer were measured by the same methods as in Example 1.

Example 2

In Example 2, an optical film was obtained in the same manner as in Example 1, except that the film thickness of the resin layer was 50 μm.

Example 3

In Example 3, an optical film was obtained in the same manner as in Example 1, except that the film thickness of the resin layer was 300 μm.

Example 4

In Example 4, an optical film was obtained in the same manner as in Example 1, except that the resin layer composition 2 was used instead of the resin layer composition 1.

Example 5

In Example 5, an optical film was obtained in the same manner as in Example 1, except that the resin layer composition 3 was used instead of the resin layer composition 1.

Example 6

A polyimide base material having a thickness of 50 μm (product name "Neopulim"; manufactured by Mitsubishi Gas Chemical Company, Inc.) was prepared as a resin base material, and the hard coat layer composition 1 was applied on a first surface of the polyimide base material by bar coater to form a coating film. Then, the formed coating film was heated at 70° C. for 1 minute to evaporate the solvent in the coating film, and was then exposed to ultraviolet light to an integrated light amount of 100 mJ/cm$^2$ in the air with an ultraviolet irradiation device (with an H bulb as a light source; manufactured by Fusion UV Systems Inc.) to obtain a semi-cured (half cured) coating film. Next, the hard coat layer composition 2 was applied on the surface of the semi-cured coating film of the hard coat layer composition 1 by a bar coater to form a coating film. The formed coating film was heated at 70° C. for 1 minute to evaporate the solvent in the coating film, and was then exposed to ultraviolet light to an integrated light amount of 200 mJ/cm$^2$ under an oxygen concentration of 200 ppm or lower with an ultraviolet irradiation device (with an H bulb as a light source; manufactured by Fusion UV Systems Inc.) to obtain completely cured (full-cured) coating films. Thus, a hard coat layer comprising a first hard coat layer having a film thickness of 10 μm on the polyimide base material and a second hard coat layer having a film thickness of 5 μm and laminated to the first hard coat layer was formed.

Meanwhile, the resin layer composition 1 was applied on the untreated surface of a polyethylene terephthalate film having a thickness of 100 μm (product name "Cosmoshine A4100"; manufactured by Toyobo Co., Ltd.) as a mold release film by a bar coater to form a coating film. Then, the formed coating film was heated at 70° C. for 1 minute to evaporate the solvent in the coating film, and was then exposed to ultraviolet light to an integrated light amount of 1200 mJ/cm$^2$ in the air with an ultraviolet irradiation device (with an H bulb as a light source; manufactured by Fusion UV Systems Inc.) to cure the coating film and thereby to form a resin layer having a film thickness of 200 μm and containing the urethane resin. After the resin layer was formed, the polyethylene terephthalate film was peeled off from the resin to obtain a simple resin layer.

Then, the resin layer was laminated to a second surface of the polyimide base material, which was opposite to the first surface, through an adhesive layer having a film thickness of 5 μm (product name "PANACLEAN PD-S1"; manufactured by PANAC Co., Ltd.) to obtain an optical film.

Comparative Example 1

In Comparative Example 1, an optical film was obtained in the same manner as in Example 1, except that the film thickness of the resin layer was 350 μm.

Comparative Example 2

In Comparative Example 2, an optical film was obtained in the same manner as in Example 1, except that the film thickness of the resin layer was 30 μm.

Comparative Example 3

In Comparative Example 3, an optical film was obtained in the same manner as in Example 1, except that the resin layer composition 4 was used instead of the resin layer composition 1.

Comparative Example 4

In Comparative Example 4, an optical film was obtained in the same manner as in Example 1, except that the resin layer composition 5 was used instead of the resin layer composition 1.

<Measurement of G', G", and Tan δ>

The shear storage modulus (G'), shear loss modulus (G"), and shear loss tangent (tan δ) of each of the optical films according to Examples and Comparative Examples were measured. Specifically, rectangular pieces of 10 mm×5 mm were first stamped out from each optical film to prepare samples. Then, each of the two samples was mounted to an optional solid shearing jig of a dynamic viscoelasticity meter (product name "Rheogel-E4000"; manufactured by UBM Corporation). Specifically, the solid shearing jig comprises one solid shearing metal plate having a thickness of 1 mm and two L-shaped metal brackets flanking the solid shearing plate. One sample was held between the solid shearing plate and one L-shaped metal bracket, and the other sample was held between the solid shearing plate and the other L-shaped metal bracket. In this case, each sample was held in such a manner that the hard coat layer faced toward the L-shaped metal bracket. Then, the distance between the L-shaped metal brackets was shortened by turning a screw to hold the samples. Subsequently, chucks for tensile testing, which consisted of upper and lower chucks, were set into a dynamic viscoelasticity meter (product name "Rheogel-E4000"; manufactured by UBM Corporation). Then, the solid shearing jig was installed in a space between the upper and lower chucks with a distance of 20 mm. Then, the temperature was increased at a rate of 2° C./min to a predetermined temperature of 25° C. Under this condition, a vertical oscillation with a strain amount of 1% and a frequency ranging from 500 Hz to 1000 Hz was applied to the two L-shaped metal brackets with keeping the solid shearing plate fixed to perform the dynamic viscoelasticity measurement of solid material at 25° C., whereby the shear storage modulus (G'), shear loss modulus (G"), and shear loss tangent (tan δ) of the optical film were measured. In this respect, the shear storage modulus (G'), shear loss modulus (G"), and shear loss tangent (tan δ) of the optical film in the frequency range from 500 Hz to 1000 Hz inclusive were calculated by applying the vertical oscillation with frequencies of 500 Hz, 750 Hz, and 950 Hz to the L-shaped metal brackets to measure the shear storage modulus (G'), shear loss modulus (G"), and shear loss tangent (tan δ) of the optical film at the respective frequencies; calculating the arithmetic means of these measured shear storage modulus (G'), shear loss modulus (G"), and shear loss tangent (tan δ), and repeating the same measurement three times and further arithmetically averaging the arithmetic means obtained from the three experiments.

<Impact Resistance Test>

The impact resistance test A was performed three times on each of the optical films according to Examples and Comparative Examples, in which each optical film was placed on the surface of a soda-lime glass having a thickness of 0.7 mm in such a manner that the soda-lime glass faced toward the resin layer, and a 100 g iron ball with a diameter of 30 mm was dropped from 30 cm above the surface of the hard coat layer of the optical film. Additionally, the impact resistance test B was performed three times on each of the optical films according to Examples and Comparative Examples, in which each optical film was placed on a soda-lime glass having a thickness of 0.7 mm by the intermediary of an adhesive sheet having a thickness of 200 µm (product name "Optically Clear Adhesive 8146-2"; manufactured by 3M Company) in such a manner that the soda-lime glass faced toward the resin layer, and a 100 g iron ball with a diameter of 30 mm was dropped from 30 cm above the surface of the hard coat layer of the optical film. In the impact resistance tests A and B, the position of dropping the iron ball was changed every time. Then, each optical film after the impact resistance test A was visually evaluated for the presence of any depression on the surface of the hard coat layer and the presence of any crack in the soda-lime glass. Additionally, each optical film after the impact resistance test B was visually evaluated for the presence of any depression on the surface of the hard coat layer. The evaluation results were based on the following evaluation criteria.

(Evaluation of a Depression on the Surface of a Hard Coat Layer)

◯: no depression was identified on the surface of a hard coat layer in both cases where the hard coat layer was observed in front and oblique directions;

Δ: no depression was identified on the surface of a hard coat layer in a case where the hard coat layer was observed in a front direction, while a depression was identified on the surface of the hard coat layer in a case where the hard coat layer was observed in an oblique direction;

x: an obvious depression was identified on the surface of a hard coat layer in both cases where the hard coat layer was observed in front and oblique directions.

(Evaluation of a crack in a soda-lime glass)

⊚: no crack was formed in a soda-lime glass;

◯: there was no crack but a damage formed in a soda-lime glass;

Δ: the formation of crack in a soda-lime glass was observed in one or two trials;

x: the formation of crack in a soda-lime glass was observed in all the three trials.

<Successive Folding Test>

Each sample prepared by cutting out a rectangular piece of 30 mm×100 mm from each of the optical films according to Examples and Comparative Examples was mounted to an endurance testing machine (product name "DLDMLH-FS"; manufactured by Yuasa System Co., Ltd.) by fixing the short edges (30 mm) of the sample to fixing members, as shown in FIG. 3(C), in such a manner that the minimum distance between the two opposing edges was 30 mm, and was tested by repeating the successive folding test (a test in which the hard coat layer is folded inward and the resin layer is folded outward) one hundred thousand times, in each of which the hard coat layer of the sample was folded back inward at an angle of 180 degrees, to examine whether any crack or break was formed at the bent part. Additionally, each new sample prepared in the same manner as described above from each of the optical films according to Examples and Comparative Examples was mounted in the same manner as described above to the above-described endurance testing machine and tested by repeating the successive folding test (a test in which the hard coat layer is folded outward and the resin layer is folded inward) one hundred thousand times, in each of which the resin of the sample was folded back inward at an angle of 180 degrees, to examine whether any crack or break was formed at the bent part. The results of the successive folding tests were evaluated based on the following evaluation criteria.

◯: no crack or break was formed at the bent part in both of the successive folding tests;

x: the formation of crack or break was observed at the bent part in either of the successive folding tests.

<Pencil Hardness>

The pencil hardness of the surface of each of the optical films according to Examples and Comparative Examples (the surface of each hard coat layer) was measured based on JIS K5600-5-4: 1999. In the pencil hardness test, a load of 1 kg was applied to a pencil and the pencil was moved at a speed of 1 mm/sec. The grade of the hardest pencil that does not scratch the surface of an optical film during the pencil hardness test is determined as the pencil hardness of the optical film. A plural number of pencils with different hardness were used for the measurement of pencil hardness and the pencil hardness test was repeated five times on each pencil. In cases where no scratch was visibly detected on the surface of the optical plate in four or more out of the five replicates when the surface of the optical film was observed under transmitting fluorescent light, the pencil with the hardness was determined to make no scratch on the surface of the optical film.

The results are shown in Table 1 below.

TABLE 1

|  | Film thickness of a resin layer (μm) | Shear storage modulus G' (MPa) | Shear loss modulus G" (MPa) | Shear loss tangent tanδ | Impact resistance test A | | Impact resistance test B | Foldability | Pencil hardness |
| --- | --- | --- | --- | --- | --- | --- | --- | --- | --- |
|  |  |  |  |  | Depression on hard coat layer surface | Crack in soda-lime glass | Depression on hard coat layer surface |  |  |
| Example 1 | 200 | 580 | 89 | 0.15 | ○ |  | ○ | ○ | 2H |
| Example 2 | 50 | 580 | 89 | 0.15 | ○ |  | ○ | ○ | 3H |
| Example 3 | 300 | 580 | 89 | 0.15 | ○ |  | ○ | ○ | 2H |
| Example 4 | 200 | 230 | 23 | 0.10 | ○ | ○ | ○ | ○ | 2H |
| Example 5 | 200 | 890 | 123 | 0.14 | ○ |  | ○ | ○ | 2H |
| Example 6 | 200 | 580 | 89 | 0.15 | ○ |  | ○ | ○ | H |
| Comparative Example 1 | 350 | 580 | 89 | 0.15 | ○ |  | ○ | x | 2H |
| Comparative Example 2 | 30 | 580 | 89 | 0.15 | ○ | x | x | ○ | 3H |
| Comparative Example 3 | 200 | 120 | 2.6 | 0.02 | Δ | x | Δ | ○ | H |
| Comparative Example 4 | 200 | 1300 | 0.2 | 0.00 | ○ | Δ | ○ | x | 3H |

The results will be described below. In the optical film according to Comparative Example 1, the resin layer has such a thick film thickness that the optical film had poor folding endurance. In the optical film according to Comparative Example 2, the resin layer has such a thin film thickness that the optical film failed to absorb impact, which resulted in the crack formation in the soda-lime glass during the impact resistance test A and also caused formation of a large amount of depression on the surface of the hard coat layer, which followed plastic deformation of the adhesive sheet, during the impact resistance test B. In the optical film according to Comparative Example 3, the shear storage modulus (G') and the shear loss modulus (G") were so small that the optical film failed to absorb impact, which resulted in the crack formation in the soda-lime glass during the impact resistance test A. In the optical film according to Comparative Example 4, the shear storage modulus (G') was so large and the shear loss modulus (G") was so small that the optical film failed to absorb impact, which resulted in the crack formation in the soda-lime glass and also led to the poor folding endurance during the impact resistance test A.

On the contrary, the optical films according to Examples 1 to 6 each had an excellent balance between the film thickness of the resin layer, the shear storage modulus (G'), and shear loss modulus (G"), and showed no depression on the surface of the hard coat layer and also showed no crack in the soda-lime glass after the impact resistance tests A and B. Additionally, the optical films according to Examples 1 to 6 achieved good results in the successive folding test.

Besides the above-described successive folding test, each sample prepared by cutting out a rectangular piece of 30 mm×100 mm from each of the optical films according to Examples 1 to 6 was mounted to an endurance testing machine (product name "DLDMLH-FS"; manufactured by Yuasa System Co., Ltd.) by fixing the short edges (30 mm) to fixing members, as shown in FIG. 3(C), in such a manner that the minimum distance between the two opposing edges was 2 mm, and was tested by repeating the successive folding test (a test in which the hard coat layer is folded inward and the resin layer is folded outward) one hundred thousand times, in each of which the hard coat layer of the sample was folded back inward at an angle of 180 degrees, to examine whether any crack or break or fracture was formed at the bent part, which indicated that no crack or break was formed at the bent part. Additionally, each new sample prepared in the same manner as described above from each of the optical films according to Examples 1 to 6 was mounted in the same manner as described above to the above-described endurance testing machine in such a manner that the minimum distance between the two opposing edges was 2 mm, and was tested by repeating the successive folding test (a test in which the hard coat layer is folded outward and the resin layer is folded inward) one hundred thousand times, in each of which the resin layer of the sample was folded back inward at an angle of 180 degrees, to examine whether any crack or break was formed at the bent part, which indicated that no crack or break was formed at the bent part.

Additionally, each sample prepared by cutting out a rectangular piece of 30 mm×100 mm from each of the optical films according to Examples 1 to 6 was folded by fixing the short edges (30 mm) of each sample to fixing members arranged in parallel to each other to produce a gap of 30 mm between the opposing edges and kept folded at 70° C. for 240 hours to perform the static folding test. When each sample was resolved after the static folding test from the folded state by removing the fixing member from one of the edges and left for 30 minutes at room temperature to measure the opening angle, which is an angle naturally formed by the unfolded optical film (see FIG. 4(B)), the opening angle of each of the optical films according to Examples 1 to 4 was 100° or more and was larger than the opening angle of the optical film according to Example 5. This result indicated that suitable reversibility is achieved when the shear storage modulus (G') is less than 800 MPa. The opening angle was measured by both types of static folding test, in one of which the hard coat layer was folded inward and in the other of which the hard coat layer was folded outward, and a smaller of the measured angles was adopted as the opening angle.

Additionally, measurement of Martens hardness in the first and second hard coat layers of each of the optical films according to Examples 1 to 6 indicated a Martens hardness of 830 MPa for the first hard coat layer and a Martens hardness of 500 MPa for the second hard coat layer. The Martens hardness values were determined using a "T1950 TriboIndenter" manufactured by Hysitron, Inc. from the value of $P_{max}/A$, where a Berkovich indenter (trigonal pyramid) was pressed into each of the first and second hard coat layers at the center of the cross-section to a depth of 500 nm, held at the position for a certain period of time to relax the residual stress, and then unloaded, under the following measurement conditions to measure the maximum load after the relaxation, and the maximum load $P_{max}$ (μN) and the area of the 500 nm deep indentation A (nm$^2$) were used to calculate $P_{max}/A$. The arithmetic mean of the measurements at 10 different locations was determined as the Martens hardness.

(Measurement Conditions)
- loading speed: 10 nm/sec;
- retention time: 5 sec;
- unloading speed: 10 nm/sec;
- measurement temperature: 25° C.

Additionally, the surface of each of the optical films according to Examples 1 to 6 (the surface of the hard coat layer) was scrubbed 10 times at a speed of 50 mm/sec with steel wool with a grade of #0000 (product name "Bonstar"; manufactured by Nihon Steel Wool Co., Ltd.) while a load of 1 kg/cm$^2$ was applied, and the resulting surface of the optical film showed no scratch when visually examined for the presence of any scratch.

LIST OF REFERENCE NUMERALS 10, 40. Optical film
10A, 12A, 40A. Surface
11. Resin base material
11A. First surface
11B. Second surface
12. Hard coat layer
12A. First hard coat layer
12B. Second hard coat layer
13. Resin layer
50. Image display device
53. Display panel
56. Adhesive layer

The invention claimed is:

1. A foldable light-transmitting optical film for use in an image display device, comprising:
   a resin base material;
   a hard coat layer provided on the first surface of the resin base material; and
   a resin layer having a film thickness of 50 μm or more and 300 μm or less and provided on the second surface of the resin base material that is opposite to the first surface;
   wherein the shear storage modulus (G') of the optical film at 25° C. in the frequency range from 500 Hz to 1000 Hz inclusive is more than 200 MPa and 1200 MPa or less; and
   the shear loss modulus (G") of the optical film at 25° C. in the frequency range from 500 Hz to 1000 Hz inclusive is 3 MPa or more and 150 MPa or less.

2. The optical film according to claim 1, wherein no crack or break is formed in the optical film after folding the optical film in a manner that leaves a gap of 30 mm between the opposite edges, unfolding the folded optical film, and repeating the process one hundred thousand times.

3. The optical film according to claim 1, wherein the resin base material is a base material containing a polyimide resin, a polyamide resin, or a combination thereof.

4. A foldable image display device, comprising:
   a display panel; and
   the optical film according to claim 1 placed on the observer's side of the display panel;
   wherein the hard coat layer of the optical film is placed on the observer's side of the resin base material.

5. The image display device according to claim 4, further comprising an adhesive layer provided between the optical film and the display panel.

6. The image display device according to claim 4, wherein the display panel is an organic light-emitting diode panel.

* * * * *